(12) United States Patent
Fukami et al.

(10) Patent No.: US 11,200,933 B2
(45) Date of Patent: Dec. 14, 2021

(54) MAGNETIC MULTILAYER FILM, MAGNETIC MEMORY ELEMENT, MAGNETIC MEMORY AND METHOD FOR PRODUCING SAME

(71) Applicant: TOHOKU UNIVERSITY, Sendai (JP)

(72) Inventors: Shunsuke Fukami, Sendai (JP); Chaoliang Zhang, Sendai (JP); Ayato Ohkawara, Sendai (JP); Kyota Watanabe, Sendai (JP); Hideo Ohno, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 431 days.

(21) Appl. No.: 16/305,649

(22) PCT Filed: Mar. 21, 2017

(86) PCT No.: PCT/JP2017/011283
§ 371 (c)(1),
(2) Date: Mar. 11, 2019

(87) PCT Pub. No.: WO2017/208576
PCT Pub. Date: Dec. 7, 2017

(65) Prior Publication Data
US 2020/0286536 A1    Sep. 10, 2020

(30) Foreign Application Priority Data
Jun. 3, 2016  (JP) .............................. JP2016-112242

(51) Int. Cl.
*G11C 11/15*   (2006.01)
*G11C 11/16*   (2006.01)
(Continued)

(52) U.S. Cl.
CPC ............ *G11C 11/161* (2013.01); *H01L 43/02* (2013.01); *H01L 43/10* (2013.01); *H01L 43/12* (2013.01)

(58) Field of Classification Search
CPC ....... G11C 11/161; H01L 43/02; H01L 43/10; H01L 43/12
(Continued)

(56) References Cited

U.S. PATENT DOCUMENTS 5,578,385 A * 11/1996 Saito ...................... B82Y 25/00
                                                      257/E43.005
9,218,864 B1    12/2015 Yi et al.
(Continued)

FOREIGN PATENT DOCUMENTS

JP    2014045196 A    3/2014
JP    2016046492 A    4/2016
(Continued)

OTHER PUBLICATIONS

ISR issued in Int'l. Application No. PCT/JP2017/011283, dated Jun. 20, 2017.
(Continued)

*Primary Examiner* — Viet Q Nguyen
(74) *Attorney, Agent, or Firm* — Greer Burns & Crain Ltd.

(57) ABSTRACT

The magnetic memory element (100) includes: a conductive layer that includes a heavy metal layer (10) containing a 5d transition metal; a first ferromagnetic layer (20) that is adjacent to the conductive layer and contains a ferromagnetic layer having a reversible magnetization; a barrier layer (30) that is adjacent to the first ferromagnetic layer (20) and includes an insulating material; a reference layer (40) that is adjacent to the barrier layer (30) and has at least one second ferromagnetic layer (41) having a fixed magnetization direc-
(Continued)

tion; a cap layer (50) that is adjacent to the reference layer (40) and includes a conductive material; a first terminal (T1) that is capable of introducing a current into one end of the heavy metal layer (10) in the longitudinal direction; a second terminal (T2) that is capable of introducing a current into the other end of the heavy metal layer (10) in the longitudinal direction; and a third terminal (T3) that is capable of introducing a current into the cap layer (50).

18 Claims, 26 Drawing Sheets

(51) Int. Cl.
*H01L 43/02* (2006.01)
*H01L 43/10* (2006.01)
*H01L 43/12* (2006.01)

(58) Field of Classification Search
USPC .......................................................... 365/173
See application file for complete search history.

(56) References Cited

U.S. PATENT DOCUMENTS

| | | | | |
|---|---|---|---|---|
| 9,343,657 | B2* | 5/2016 | Yamane | H01L 43/10 |
| 10,360,960 | B2* | 7/2019 | Kato | H01L 43/08 |
| 10,566,521 | B2* | 2/2020 | Eom | G11C 11/18 |
| 10,586,579 | B2* | 3/2020 | Wang | H01F 41/307 |
| 10,686,123 | B2* | 6/2020 | Hu | G11C 11/161 |
| 10,937,947 | B2* | 3/2021 | Yoshikawa | G11C 11/161 |
| 2019/0006581 | A1* | 1/2019 | Eom | H01L 43/08 |

FOREIGN PATENT DOCUMENTS

| | | |
|---|---|---|
| JP | 2017059594 A | 3/2017 |
| WO | 2013025994 A2 | 2/2013 |
| WO | 2016011435 A1 | 1/2016 |
| WO | 2016021468 A1 | 2/2016 |

OTHER PUBLICATIONS

Chi-Fend Pai et al.; "Spin transfer torque devices utilizing the giant spin Hall effect of tungsten"; Appl. Phys. Lett. 101, 122404 (2013; https://doi.org/10.1063/1.4753947.

* cited by examiner

MAGNETIC MULTILAYER FILM, MAGNETIC MEMORY ELEMENT, MAGNETIC MEMORY AND METHOD FOR PRODUCING SAME

This is a National Phase Application filed under 35 U.S.C. § 371, of International Application No. PCT/JP2017/011283, filed Mar. 21, 2017, the contents of which are incorporated by reference.

TECHNICAL FIELD

The present disclosure relates to a magnetic multilayer film, a magnetic memory element, a magnetic memory, and a method for producing the same.

BACKGROUND ART

A magnetic memory, or a magnetic random access memory (MRAM), is a nonvolatile memory featuring an unlimited number of rewrites and high-speed operation. A magnetic memory is hoped to serve as a substitute for a static random access memory (SRAM) or a dynamic random access memory (DRAM).

In general, a magnetic memory includes magnetic memory elements arranged in an array and a peripheral circuit formed on the periphery of the magnetic memory elements. A magnetic memory element includes a magnetic tunnel junction (MTJ) that includes two ferromagnetic layers and one insulating layer (tunnel barrier) formed between the two ferromagnetic layers. One of the two ferromagnetic layers, or a reference layer, has a fixed magnetization direction and the other, a recording layer, has a reversible magnetization direction. A magnetic memory stores information in a magnetization direction of the recording layer. Thus, when writing information, it is necessary to reverse a magnetization direction of the recording layer. When information is read out, a tunnel magneto resistance (TMR) effect is utilized in which a tunnel resistance of the magnetic tunnel junction varies with a relative angle between a magnetization direction of the recording layer and that of the reference layer.

A magnetic memory element is roughly classified into a two-terminal type and a three-terminal type, depending on a structure of the element. A two-terminal type magnetic memory element has a small cell size and is thus suited for capacity enlargement, and is hoped to serve mainly as a substitute for a DRAM. A three-terminal type magnetic memory element has a separate current path for an information write or read operation. A write current does not pass through an insulating layer of a three-terminal type magnetic memory element, which ensures high-speed and highly reliable operation, and this type is hoped to serve mainly as a substitute for an SRAM.

A method for writing information to a magnetic memory element, that is, a method for reversing a magnetization direction of a recording layer, has been examined in various ways. A magnetic memory in an early stage of research and development utilized an Oersted magnetic field generated around a current that is fed to wiring. Afterwards, as a method with improved miniaturization characteristics, magnetization reversal by a spin-transfer torque (STT) was demonstrated that reverses a magnetization direction with an angular momentum transferred between a spin-polarized electron and a magnetization, thus activating research and development. Magnetization reversal by an STT can be used mainly for a two-terminal type magnetic memory element.

As a method for writing information to a three-terminal type magnetic memory element, there is proposed a method using domain wall displacement induced by a current, in addition to a method using an Oersted magnetic field. Domain wall displacement induced by a current refers to a phenomenon in which feeding a current to a fine wire made from a ferromagnetic substance including a magnetic domain wall causes the magnetic domain wall to be transferred by the current in a longitudinal direction of the fine wire. This phenomenon occurs via the spin transfer torque. In recent years, in addition to the domain wall displacement induced by a current, a method using magnetization reversal by a spin-orbit interaction has been proposed and gained attention. Patent Literature 1 discloses a three-terminal type magnetic memory using magnetization reversal by a spin-orbit interaction.

Magnetization reversal by a spin-orbit interaction is a phenomenon: a magnetization direction of a layer of a ferromagnetic material is reversed by feeding a current in the in-plane direction of a heavy metal layer in a multilayer film that includes a layer made from a non-magnetic heavy metal material such as platinum (Pt), tantalum (Ta) or tungsten (W), a layer made from a ferromagnetic material and a layer made from an oxide laminated one on another and that does not have symmetry of reversal. In this phenomenon, spin-polarized electrons are accumulated on a layer made from a ferromagnetic material, which exerts a torque on a magnetization direction. This torque is called a spin orbit torque (SOT). Magnetization reversal by a spin orbit torque is referred to, for example, as a spin-orbit-torque-induced magnetization switching. The origin of a spin orbit torque has not yet been clarified although various guesses have been made including a spin Hall effect in a heavy metal material and a Rashba effect at an interface between a heavy metal material and a ferromagnetic material.

Using a material having a large spin orbit torque generated by a unit current enables high integration of a magnetic memory and allows a magnetic memory to be driven with a small electric power. This approach is preferable in terms of application. Patent Literature 1 describes that using, as a heavy metal material, Ta or W having a β-phase crystal structure, increases a spin orbit torque by unit current.

CITATION LIST

Patent Literature

Patent Literature 1: International Publication No. WO 2013-025994

Non Patent Literature

Non Patent Literature 1: Applied Physics Letters, vol. 101, 122404 (2012)

SUMMARY OF INVENTION

Technical Problem

When forming a three-terminal type magnetic memory element in which a magnetization reversal by a spin orbit torque occurs, it is desirable to set a film thickness of a heavy metal layer to 6 nm or more in order to ensure a process margin. The reason for this is: a heavy metal layer is etched to a certain degree in a process of patterning an MTJ arranged on a heavy metal layer via etching, and accordingly, it is necessary to form, in advance, a heavy metal layer having a sufficient thickness after etching, that is, it is necessary to ensure a process margin.

As mentioned above, using a heavy metal layer made from Ta or W having a crystal structure of metastable β-phase obtains a large spin orbit torque (refer to Patent Literature 1). However, when a thickness of a heavy metal layer is increased in order to ensure a process margin, an α-phase crystal structure that is the most stable structure is formed predominantly and a β-phase crystal structure is not obtained. For example, Non Patent Literature 1 describes that, while a β-phase crystal structure is predominant in a W film 5.2 nm thick, both a β-phase crystal structure and an α-phase crystal structure are found in a W film 6.2 nm thick, and only an α-phase crystal structure is found in a W film 15 nm thick. An electrical resistivity of a heavy metal layer made from W having a thickness of 5.2 nm, 6.2 nm, and 15 nm is reported to be 260 μΩ cm, 80 μΩ cm, and 21 μΩ cm, respectively.

As understood from the above, it is difficult to obtain a heavy metal layer having a β-phase crystal structure in order to obtain a large spin orbit torque by using a relatively small current, and at the same time, to ensure a process margin. Accordingly, it is not easy to ensure a sufficient process margin while reducing a write current of a three-terminal type magnetic memory element.

The present disclosure has been developed in consideration of the above circumstances and an objective of the present disclosure is to provide a magnetic multilayer film capable of reducing a write current of a three-terminal type magnetic memory element that uses magnetization reversal by a spin orbit torque while ensuring a process margin, a magnetic memory element using the magnetic multilayer film, a magnetic memory, and a method for producing the same.

Solution to Problem

In order to attain the above objective, a magnetic multilayer film according to a first aspect of the present disclosure is a magnetic multilayer film for a magnetic memory element including:
a conductive layer that includes a heavy metal layer containing a 5d transition metal; and
a first ferromagnetic layer that is adjacent to the conductive layer and contains a ferromagnetic layer having a reversible magnetization,
wherein a film thickness of the conductive layer is 6 nm or more, and
a crystal structure of the heavy metal layer is amorphous or β-phase.

A magnetic multilayer film according to a second aspect of the present disclosure is a magnetic multilayer film for a magnetic memory element including:
a conductive layer that includes a heavy metal layer containing a 5d transition metal; and
a first ferromagnetic layer that is adjacent to the conductive layer and contains a ferromagnetic layer having a reversible magnetization,
wherein a film thickness of the conductive layer is 6 nm or more, and
a resistivity of the heavy metal layer is 100 μΩ cm or more.

For example, a crystal structure of the heavy metal layer may be amorphous or β-phase.

For example, the conductive layer may further include an adjustment layer that is adjacent to the heavy metal layer and that includes a conductive material.

For example, the heavy metal layer desirably contains Ta or W.

A magnetic memory element according to a third aspect of the present disclosure includes:
the magnetic multilayer film;
a barrier layer that is adjacent to the first ferromagnetic layer and includes an insulating material;
a reference layer that is adjacent to the barrier layer and includes at least one ferromagnetic layer having a fixed magnetization direction;
a cap layer that is adjacent to the reference layer and includes a conductive material;
a first terminal that is capable of introducing a current into one end of the heavy metal layer in the longitudinal direction;
a second terminal that is capable of introducing a current into the other end of the heavy metal layer in the longitudinal direction; and
a third terminal that is capable of introducing a current into the cap layer.

The magnetic memory element may include a fourth terminal connected to the first ferromagnetic layer.

The first ferromagnetic layer may have a reversible magnetization in a direction perpendicular to a film surface.

The first ferromagnetic layer may have a reversible magnetization in a direction orthogonal to a line segment connecting the first terminal and the second terminal within a film surface.

The first ferromagnetic layer may have a reversible magnetization in a direction parallel to a line segment connecting the first terminal and the second terminal within a film surface.

The magnetic memory element may be configured:
wherein
the first ferromagnetic layer includes a first magnetized area, and a second magnetized area and a third magnetized area arranged across the first magnetized area,
a magnetization of the second magnetized area and a magnetization of the third magnetized area are fixed in mutually different directions, and
a magnetization of the first magnetized area is reversible and can be oriented in the same direction as any one of a magnetization of the second magnetized area and a magnetization of the third magnetized area.

A magnetic memory according to a fourth aspect of the present disclosure includes:
the magnetic memory element;
write means for writing data to the magnetic memory element by feeding a write current to the magnetic memory element; and
read means for reading data written into the magnetic memory element by determining a tunnel resistance by feeding a current in a direction penetrating the barrier layer.

The magnetic multilayer film, the magnetic memory element or the magnetic memory may be configured:
wherein
the heavy metal layer is deposited by magnetron sputtering,
a partial pressure of an inert gas in a film forming process is 0.1 Pa or more,
a mean free path of a sputtered particle in a film forming process is shorter than a T/S distance,
a deposition rate of a thin film in a film forming process is 0.02 nm/s or less,
a substrate temperature may be set to 0° C. or less in a film forming process, and a bias voltage is applied to a substrate in a film forming process.

A method for producing a magnetic multilayer film or a magnetic memory element according to a fifth aspect of the present disclosure is a method for producing a magnetic multilayer film or a magnetic memory element including the magnetic multilayer film, the magnetic multilayer film including:

a heavy metal layer containing a 5d transition metal; and
a first ferromagnetic layer that is adjacent to the heavy metal layer and contains a ferromagnetic layer having a reversible magnetization, wherein the heavy metal layer is deposited by magnetron sputtering, and a partial pressure of an inert gas in a film forming process is 0.1 Pa or more.

A method for producing a magnetic multilayer film or a magnetic memory element according to a sixth aspect of the present disclosure is a method for producing a magnetic multilayer film or a magnetic memory element including the magnetic multilayer film, the magnetic multilayer film including:

a heavy metal layer containing a 5d transition metal; and
a first ferromagnetic layer that is adjacent to the heavy metal layer and contains a ferromagnetic layer having a reversible magnetization, wherein the heavy metal layer is deposited by magnetron sputtering, and a mean free path of a sputtered particle in a film forming process is shorter than a T/S distance.

Desirably, a deposition rate of a thin film in a film forming process of the heavy metal layer is 0.02 nm/s or less.

Desirably, a substrate temperature is set to 0° C. or less in a film forming process of the heavy metal layer.

A bias voltage may be applied to a substrate in a film forming process of the heavy metal layer.

Advantageous Effects of Invention

According to the present disclosure, it is possible to provide a magnetic multilayer film that has a small write current and ensures a process margin, thus being applicable to a magnetic memory element, a magnetic memory element using the magnetic multilayer film, a magnetic memory, and a method for producing the same.

BRIEF DESCRIPTION OF DRAWINGS

FIG. 3 illustrates a memory state of the magnetic memory element of FIG. 2A in which

FIG. 4 illustrates a method for writing information to the magnetic memory element of FIG. 2A in which

FIG. 5 illustrates a method for reading information from the magnetic memory element of FIG. 2A in which

FIG. 11 illustrates a deposition rate in a sputtering film forming process of W in which

FIG. 14 illustrates a measurement result of a magnetization reversal in a magnetic memory element that has been produced in which

DESCRIPTION OF EMBODIMENTS

Embodiment 1

Figure 1:
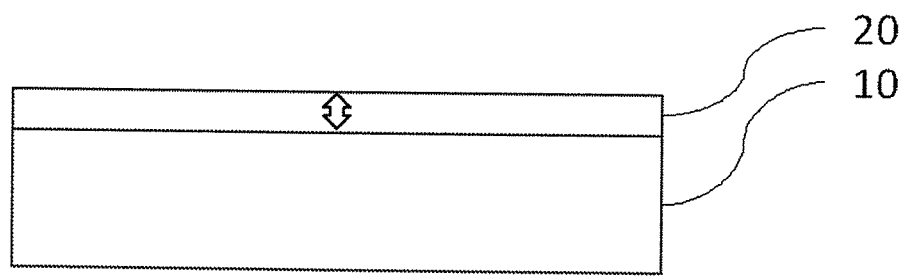
FIG. 1 is a front view illustrating a structure of a magnetic multilayer film according to Embodiment 1 of the present disclosure.

FIG. 1 is a front view illustrating a structure of a magnetic multilayer film 0 according to Embodiment 1 of the present disclosure. The magnetic multilayer film 0 has a structure in which a heavy metal layer 10 and a first ferromagnetic layer 20 are adjacent to each other and laminated one on the other. The term "adjacent" as used herein refers not only to a directly adjacent structure but also to a structure arranged via another layer or space, which structure falls within a scope that does not harm any one of the functions described below. The same applies in the following description.

The heavy metal layer 10 includes a 5d transition metal, for example, tungsten (W) or tantalum (Ta). The heavy metal layer 10 has a crystal structure of metastable β-phase crystal structure or an amorphous structure. Preferably, the film thickness of the heavy metal layer 10 is 6 nm or more. The term film thickness as used herein refers to a film thickness of a portion, adjacent to a first ferromagnetic layer 20, of the heavy metal layer 10. For example, the film thickness refers to a film thickness of an area of the heavy metal layer 10 of a magnetic memory element 100 illustrated in FIG. 2A on which area the first ferromagnetic layer 20 is formed. A resistivity of the heavy metal layer 10 is 100 μΩ cm or more.

The first ferromagnetic layer 20 includes a ferromagnetic substance and a magnetization direction retained (a direction from S to N) has a reversible characteristic. A reversible magnetization direction of the first ferromagnetic layer 20 is illustrated by an arrow in FIG. 1. In the embodiment illustrated in FIG. 1, the magnetization direction is perpendicular to a film surface and is reversible between upward and downward directions.

The magnetic multilayer film 0 may be capped with an appropriate material such as an insulator or a metal.

Figure 2A:
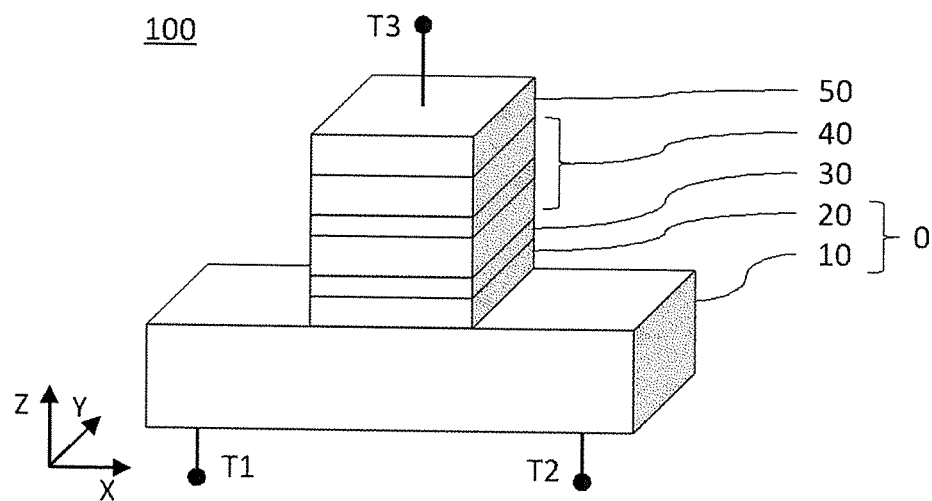
FIG. 2A is a perspective view of a magnetic memory element using the magnetic multilayer film of FIG. 1.

FIG. 2A illustrates a structure of the magnetic memory element 100 using the magnetic multilayer film 0. A front view (X-Z plane), a side view (Y-Z plane) and a plan view (X-Y plane) of the magnetic memory element 100 are illustrated respectively in FIG. 2B, FIG. 2C and FIG. 2D.

Figure 2B:
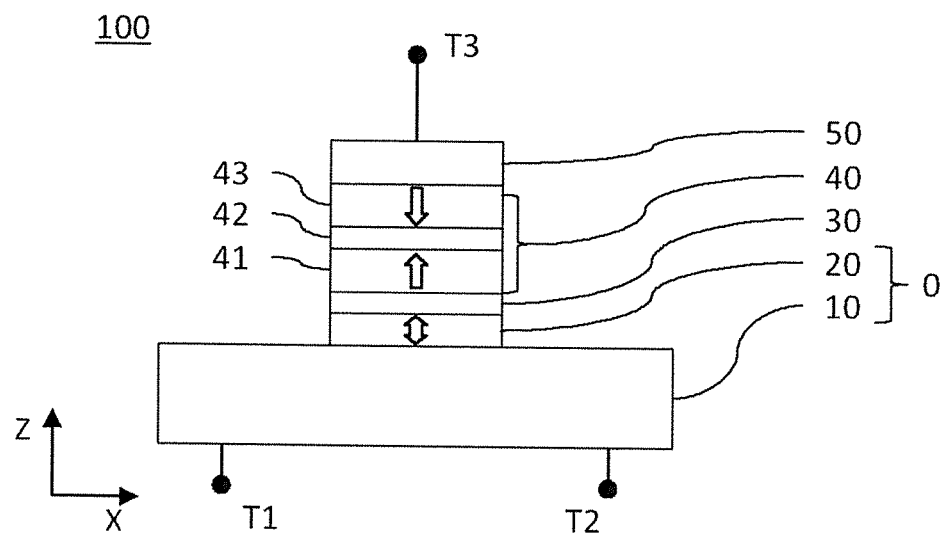
FIG. 2B is a front view (X-Z plane) of the magnetic memory element of FIG. 2A.
Figure 2C:
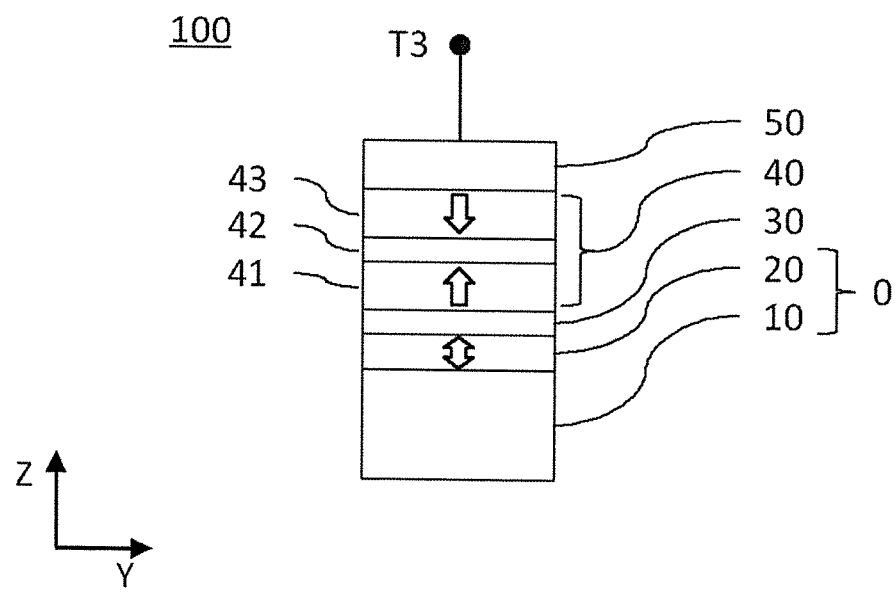
FIG. 2C is a side view (Y-Z plane) of the magnetic memory element of FIG. 2A.
Figure 2D:
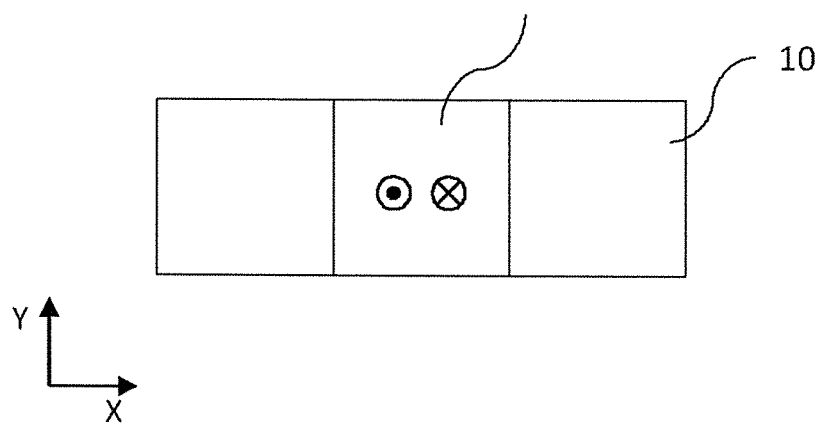
FIG. 2D is a plan view (X-Y plane) of the magnetic memory element of FIG. 2A.

As illustrated in FIGS. 2A through 2C, the magnetic memory element 100 includes the magnetic multilayer film 0, a barrier layer (insulating layer) 30, a reference layer 40 and a cap layer 50 that are laminated in this order, and further includes a first terminal T1, a second terminal T2, and a third terminal T3. The first terminal T1 is connected to one end of the magnetic multilayer film 0 and the second terminal T2 is connected to the other end of the magnetic multilayer film 0. Specifically, the first terminal T1 and the second terminal T2 are connected to both ends of the heavy metal layer 10 of the magnetic multilayer film 0.

In the following description, an XYZ coordinate system is specified in which a long axis direction (stretching direction) of the magnetic multilayer film 0 is an X direction, a short axis direction is a Y direction, and a direction orthogonal to the X direction in the Y direction is a Z direction, which coordinate system is referenced as appropriate.

The barrier layer 30 is arranged adjacent to the first ferromagnetic layer 20 of the magnetic multilayer film 0. The barrier layer 30 includes an insulating material.

The reference layer 40 includes at least one ferromagnetic layer. The reference layer 40 in the present embodiment has a structure in which a second ferromagnetic layer 41, a coupling layer 42, and a third ferromagnetic layer 43 are laminated in this order. The reference layer 40 may include a single ferromagnetic layer or a three or more ferromagnetic layers. A magnetization direction of a ferromagnetic layer constituting the reference layer 40, strictly speaking, a second ferromagnetic layer 41 adjacent to the barrier layer 30, is virtually fixed. A magnetization direction of the second ferromagnetic layer 41 is virtually fixed in an upward direction and that of the third ferromagnetic layer 43 is virtually fixed in a downward direction. The coupling layer 42 serves to couple a magnetization direction of the second ferromagnetic layer 41 and that of the third ferromagnetic layer 43 in antiparallel directions to each other. A coupling mechanism as used here may be Ruderman Kittel Kasuya Yoshida (RKKY) interaction. It is possible to reduce a total magnetic field applied to the first ferromagnetic layer 20 and make symmetrical the energy of each of two memory states (a state in which a magnetization is upward and a state in which a magnetization is downward) by coupling two ferromagnetic layers in antiparallel directions to each other via the coupling layer 42.

A magnetic tunnel junction is formed by the first ferromagnetic layer 20, the barrier layer 30, and the second ferromagnetic layer 41.

The cap layer 50 includes a conductive material. The cap layer 50 protects the magnetic tunnel junction. The third terminal T3 is connected to the cap layer 50.

As illustrated in FIG. 2B, the magnetic memory element 100 includes three terminals. Note that the magnetic memory element according to the present embodiment may include three or more terminals. For example, the first terminal T1 and the second terminal T2 may be connected to the heavy metal layer 10 and the third terminal T3 may be connected to the cap layer, and a fourth terminal (not illustrated) may be connected to a fourth ferromagnetic layer (not illustrated). In these structures, the fourth ferromagnetic layer is adjacent to the barrier layer 30 and arranged between the barrier layer 30 and the first ferromagnetic layer 20. The fourth ferromagnetic layer has a reversible magnetization and a direction of the magnetization varies with a magnetization direction of the first ferromagnetic layer 20. The fourth terminal may be arranged on the first ferromagnetic layer 20. In other words, the fourth terminal may be electrically connected to the first ferromagnetic layer 20 in a direct way or an indirect way.

Next, a structure of magnetization in a state in which the magnetic memory element 100 stores information "0" or "1" will be described with reference to FIG. 3.

Figure 3A:
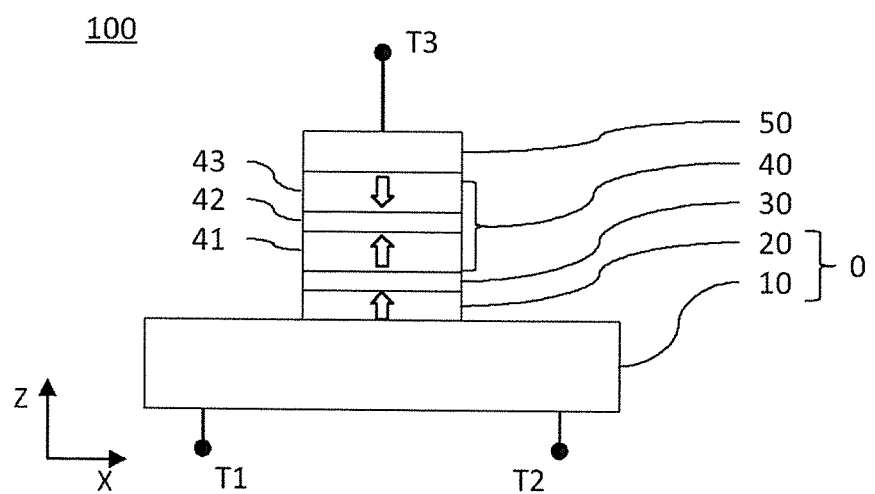
FIG. 3A illustrates a magnetization in a state in which "0" is stored and FIG. 3B illustrates a magnetization in a state in which "1" is stored.
Figure 3B:
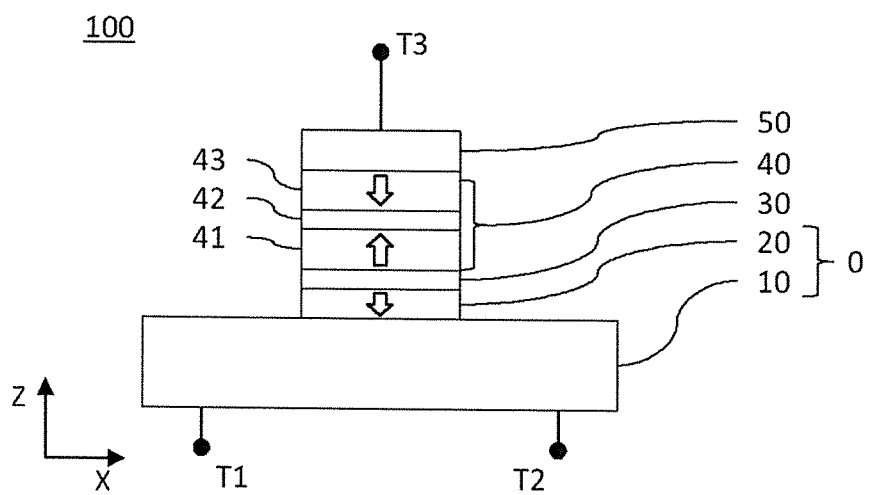

A schematic front view of a structure of magnetization in a state in which the magnetic memory element 100 stores information "0" is illustrated in FIG. 3A. A schematic front view of a structure of magnetization in a state in which the magnetic memory element 100 stores information "1" is illustrated in FIG. 3B. In a state in which the magnetic memory element 100 stores "0", a magnetization of the first ferromagnetic layer 20 is upward. In this state, directions of magnetization in a magnetic tunnel junction are parallel to each other. In a state in which the magnetic memory element 100 stores "1", a magnetization of the first ferromagnetic layer 20 is downward. As a result, directions of magnetization in a magnetic tunnel junction are antiparallel to each other. Note that data to be stored in a memory and a magnetization state may be arbitrarily defined, for example, just in the opposite way to the relation illustrated in FIG. 3.

Figure 4A:
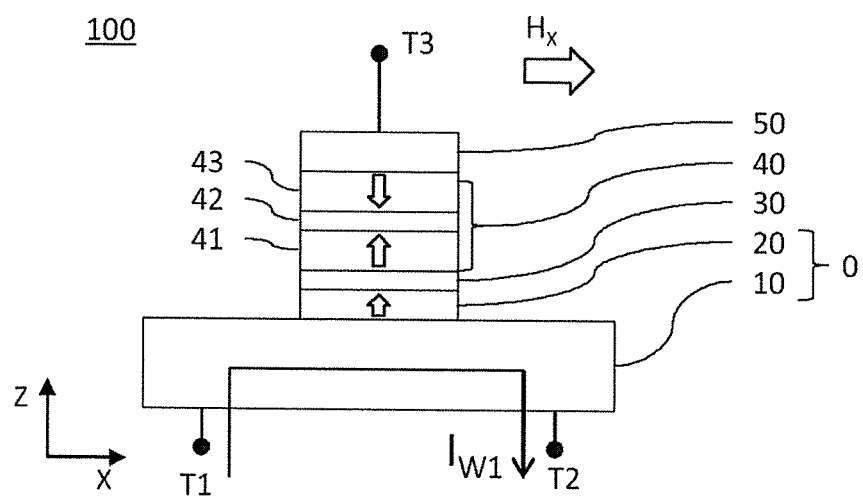
FIG. 4A illustrates a method for writing "1" and FIG. 4B illustrates a method for writing "0"
Figure 4B:
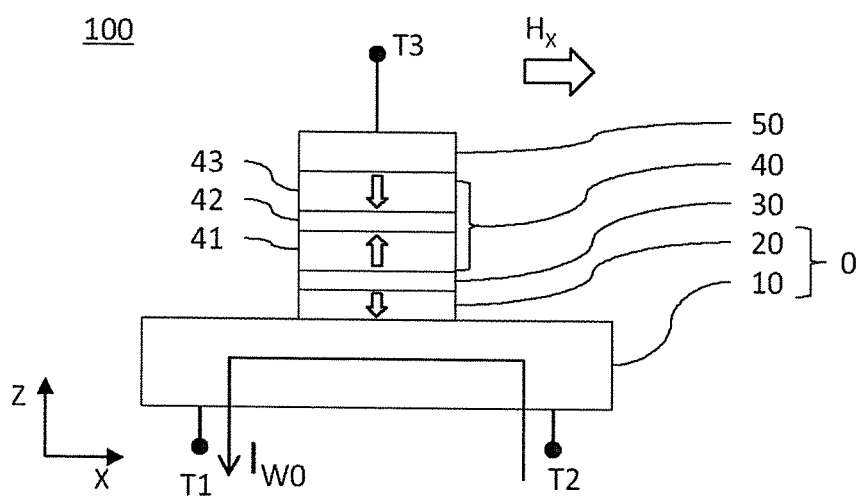

Next, a method for writing information "0" or "1" to the magnetic memory element 100 will be described with reference to FIG. 4. FIG. 4A illustrates an operation to write "1" and FIG. 4B illustrates an operation to write "0".

Magnetization reversal by a spin orbit torque is used when information is written to the magnetic memory element 100. Thus, a write current flows in the in-plane direction of the heavy metal layer 10 via the first terminal T1 and the second terminal T2.

In the magnetic memory element 100, the first ferromagnetic layer 20 responsible for storage of information has a reversible magnetization direction in a perpendicular direction. When a magnetization direction in a perpendicular direction is to be reversed by a spin orbit torque, a steady magnetic field in a parallel direction to a current is required. As illustrated in FIG. 4, a magnetic field $H_x$ in an X direction is applied as a steady magnetic field in a parallel direction to the current.

When "1" is written to the magnetic memory element 100, a write current $I_{W1}$ is fed from the first terminal T1 to the second terminal T2 via the heavy metal layer 10. On the other hand, when "0" is written to the magnetic memory element 100, a write current $I_{w0}$ is fed from the second terminal T2 to the first terminal T1 via the heavy metal layer 10.

This allows switching between the state in which "0" is stored that is defined in FIG. 3A and the state in which "1" is stored that is defined in FIG. 3B. Note that a relation between a direction of a write current, a direction of a steady magnetic field in the in-plane direction, and a direction of a magnetization reversal may vary depending on a combination of materials used for the heavy metal layer 10, the first ferromagnetic layer 20 and the barrier layer 30. Specifically, a direction of a spin orbit torque is determined by a combination of materials used for the heavy metal layer 10, the first ferromagnetic layer 20 and the barrier layer 30, and a direction of a current in an operation to write "1" or "0" is determined accordingly.

Note that a spin Hall effect or a Rashba effect has been considered as a mechanism of generation of a spin orbit torque. In this regard, the present disclosure does not pay attention to the principle, as long as a current introduced into the magnetic multilayer film 0 generates a torque that magnetizes the first ferromagnetic layer 20 via a spin-orbit interaction thereby inducing a magnetization reversal by rotation of a magnetization direction.

A minimum magnitude of a necessary write current (density) and a necessary pulse width are determined by a combination of materials used for the heavy metal layer 10, the first ferromagnetic layer 20, and the barrier layer 30. A magnitude of a write current density is typically 0.2 to $2 \times 10^{12}$ A/m$^2$. Assuming that a current flows through the heavy metal layer 10, a width of the heavy metal layer 10 in a Y direction of 50 nm and a film thickness in a Z direction of 6 nm correspond to a magnitude of a write current of 60 to 600 µA. A pulse width of a write current is typically 0.2 to 5 ns.

Next, a method for reading information "0" or "1" from the magnetic memory element 100 will be described with reference to FIG. 5.

When information is read from the magnetic memory element 100, a tunnel magneto resistance effect is used as described below.

Figure 5A:
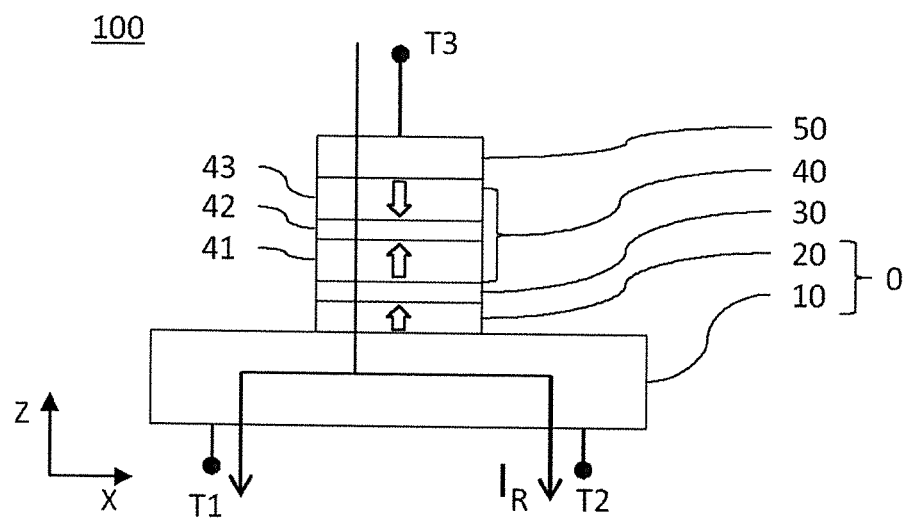
FIG. 5A illustrates a method for reading information in a state in which "0" is stored and FIG. 5B illustrates a method for reading information in a state in which "1" is stored.
Figure 5B:
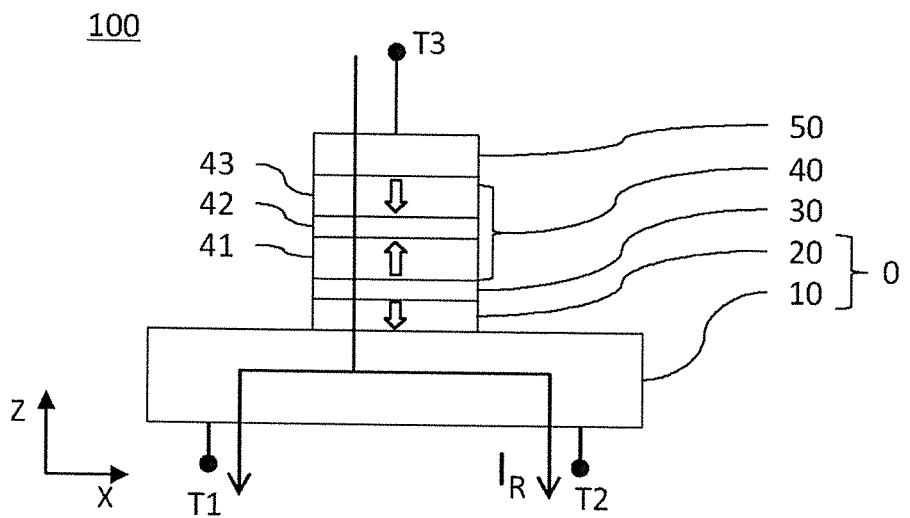

A read current is fed in a direction penetrating a magnetic tunnel junction including the first ferromagnetic layer 20, the barrier layer 30 and the reference layer 40, and information is read by using a difference in a tunnel resistance of a magnetic tunnel junction between a state in which "0" is stored and a state in which "1" is stored. When information is read, as illustrated in FIGS. 5A and 5B, a read current $I_R$ is fed from the third terminal T3 to the first terminal T1, and then to the second terminal T2. In the state illustrated in FIG. 5A in which "0" is stored, a magnetization direction of the first ferromagnetic layer 20 and that of the second ferromagnetic layer 41 are parallel to each other, and thus the resistance is low and a current flowing on a reference voltage is relatively large. On the other hand, in the state illustrated in FIG. 5B in which "1" is stored, a magnetization direction of the first ferromagnetic layer 20 and that of the second ferromagnetic layer 41 are antiparallel to each other, and thus the resistance is high and a current flowing on a reference voltage is relatively small. In other words, in the state illustrated in FIG. 5A in which "0" is stored, a magnetization direction of the first ferromagnetic layer 20 and that of the second ferromagnetic layer 41 are parallel to each other and thus the resistance is low and a voltage necessary to feed a reference current is relatively small. On the other hand, in the state illustrated in FIG. 5B in which "1" is stored, a magnetization direction of the first ferromagnetic layer 20 and that of the second ferromagnetic layer 41 are antiparallel to each other and thus the resistance is high and a voltage necessary to feed a reference current is relatively large.

Note that, when the magnetic memory element 100 includes a fourth terminal, that is, includes a terminal on a fourth ferromagnetic layer arranged between the barrier layer 30 and the first ferromagnetic layer 20 or on the first ferromagnetic layer 20, a read current may be fed across the third terminal T3 and the fourth terminal. Operation of feeding a write current is the same as mentioned above.

(Memory Cell Circuit)

Next, an example configuration of a memory cell circuit will be described with reference to FIG. 6, that uses, as a storage element, the magnetic memory element 100 of the above configuration.

Figure 6:
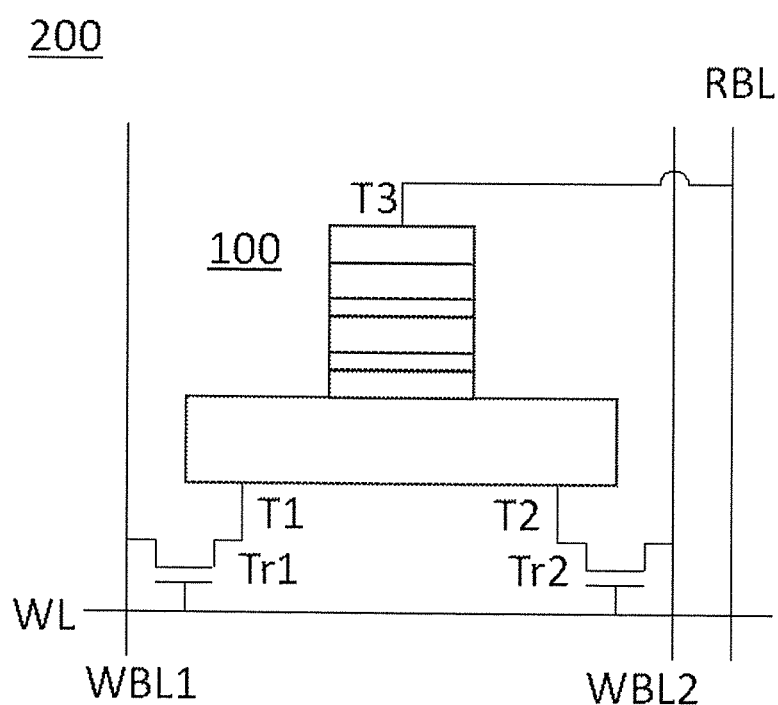
FIG. 6 illustrates an example circuit configuration of a memory cell circuit for one bit using the magnetic memory element of FIG. 2A.

FIG. 6 illustrates a configuration of a one-bit magnetic memory cell circuit 200. The magnetic memory cell circuit 200 includes the magnetic memory element 100 constituting a one-bit memory cell, a pair of write bit lines WBL1, WBL2, a word line WL, a read bit line RBL, a first transistor Tr1, and a second transistor Tr2.

The third terminal T3 of the magnetic memory element 100 is connected to the read bit line RBL. The first terminal T1 is connected to a drain of the first transistor Tr1 and the second terminal T2 is connected to a drain of the second transistor Tr2. A gate electrode of each of the first transistor Tr1 and the second transistor Tr2 is connected to the word line WL. A source of the first transistor Tr1 is connected to the first write bit line WBL1 and a source of the second transistor Tr2 is connected to the second write bit line WBL2.

Before information is written to the magnetic memory element 100, an active-level signal to turn on the transistors Tr1, Tr2 is applied to the word line WL in order to select the magnetic memory element 100. In this context, it is assumed that the transistors Tr1 and Tr2 each include an N-channel metal oxide semiconductor (MOS) transistor. In this case, a voltage of the word line WL is set to a high level. This turns on the first transistor Tr1 and the second transistor Tr2. A voltage of one of the first write bit line WBL1 and the second write bit line WBL2 is set to a high level and a voltage of the other is set to a low level, depending on data to be written.

Specifically, when data "1" is written, a voltage of the first write bit line WBL1 is set to a high level and a voltage of the second write bit line WBL2 is set to a low level. This causes a write current $I_{W1}$ to flow into the heavy metal layer 10 in a forward direction and writes data "1" to the magnetic memory element 100, as illustrated in FIG. 4A.

On the other hand, when data "0" is written, a voltage of the first write bit line WBL1 is set to a low level and a voltage of the second write bit line WBL2 is set to a high level. This causes a write current $I_{W0}$ to flow into the heavy metal layer 10 in a backward direction and writes data "0" to the magnetic memory element 100, as illustrated in FIG. 4B.

In this way, bit data is written to the magnetic memory element 100.

On the other hand, when information stored in the magnetic memory element 100 is read, the word line WL is set to an active level and the first transistor Tr1 and the second transistor Tr2 are turned on. Then, a voltage of the read bit line RBL is set to a high level. From the read bit line RBL of which voltage is set to a high level, a current flows in the order of the third terminal T3, the cap layer 50, the reference layer 40, the barrier layer 30, the first ferromagnetic layer 20, the heavy metal layer 10, the first terminal T1, the second terminal T2, the first transistor Tr1, the second transistor Tr2, the first write bit line WBL1, and the second write bit line WBL2. A magnitude of a resistance of a magnetic tunnel junction, that is, stored data, is determined by measuring a magnitude of the current.

The configuration or circuit operation of the magnetic memory cell circuit 200 described above is only illustrative and may be changed as appropriate. For example, a configuration is possible in which a current is caused to flow from the heavy metal layer 10 to the cap layer 50 by connecting the third terminal T3, instead of the read bit line RBL, to a ground line GND and setting, for a data read operation, a voltage of each of the first write bit line WBL1 and the second write bit line WBL2 to a high level, or setting a voltage of one of the first write bit line WBL1 and the second write bit line WBL2 to a high level and setting the other to Open.

Next, a configuration of a magnetic memory 300 including a plurality of magnetic memory cell circuits 200 will be described with reference to FIG. 7.

Figure 7:
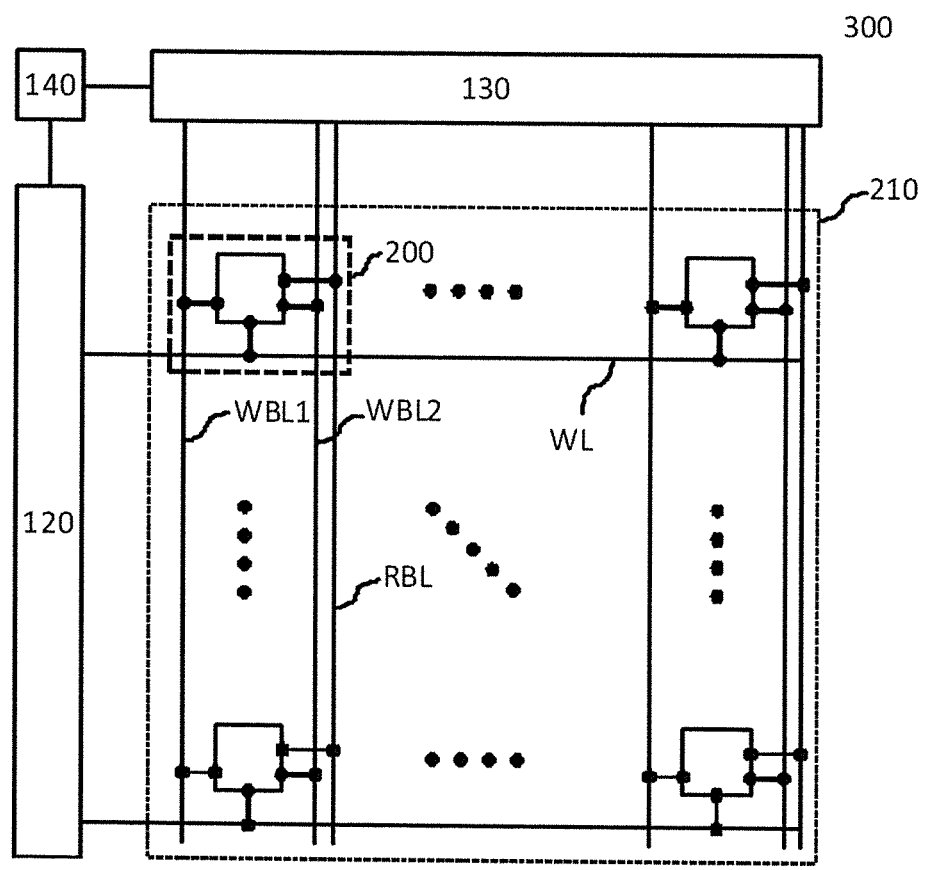
FIG. 7 is a block diagram of a magnetic memory in which a plural number of the memory cell circuit illustrated in FIG. 6 are arranged.

The magnetic memory 300 includes a magnetic memory cell array 210, an X-driver 120, a Y-driver 130, and a controller 140, as illustrated in FIG. 7.

The magnetic memory cell array 210 includes magnetic memory cell circuits 200 arranged in an array of N rows and M columns. A magnetic memory cell circuit 200 in each column is connected to a first write bit line WBL1 and a second write bit line WBL2, and a read bit line RBL in a corresponding column. A magnetic memory cell circuit 200 in each row is connected to a word line WL in a corresponding row.

The X-driver 120 connected to a plurality of word lines WL receives a row address, decodes the row address, and drives a voltage of a word line WL in a row as an access target to an active level, or alternatively to a high level when the first and second transistors T11, Tr2 are N-channel MOS transistors.

The Y-driver 130 functions as write means for writing data to the magnetic memory element 100 and read means for reading data from the magnetic memory element 100. The Y-driver 130 is connected to a plurality of first write bit lines WBL1 and a plurality of second write bit lines WBL2. The Y-driver 130 receives a column address, decodes the column address, and sets, to a desired data write state or read state, a first write bit line BL1 and a second write bit line BL2 connected to a magnetic memory cell circuit 200 as an access target.

In other words, the Y-driver 130, when writing data "1", sets, to a high level, a voltage of a first write bit line WBL1 connected to a magnetic memory cell circuit 200 as a target of data write and sets a voltage of a second write bit line WBL2 to a low level. The Y-driver 130, when writing data "0", sets a voltage of a first write bit line WBL1 to a low level and sets a voltage of a second write bit line WBL2 to a high level.

Further, when reading information stored in a magnetic memory cell circuit 200, the Y-driver 130 sets a voltage of a read bit line RBL to a high level and connects, to a ground, a first write bit line WBL1 and a second write bit line WBL2. A sense amplifier (not illustrated) compares a current flowing though a read bit line RBL with a reference value, determines a resistance state of a magnetic memory cell circuit 200 in each column, and thereby read stored data.

The controller 140 controls the X-driver 120 or the Y-driver 130 depending on a data write operation or a data read operation.

(Material and Size of Magnetic Multilayer Film and Magnetic Memory Element)

Next, a material that may be used for the magnetic multilayer film 0 or the magnetic memory element 100 will be described.

The heavy metal layer 10 contains at least a 5d transition metal. Specifically, examples of a 5d transition metal include hafnium (Hf), tantalum (Ta), tungsten (W), rhenium (Re), osmium (Os), iridium (Ir), and platinum (Pt). Preferably, the heavy metal layer 10 contains Ta or W. A crystal structure of the heavy metal layer 10 is metastable β-phase or amorphous. More preferably, the heavy metal layer 10 includes W. An electrical resistivity of the heavy metal layer 10 is 100 µΩ cm or more.

The first ferromagnetic layer 20 contains at least Fe, Co and Ni, and has a spontaneous magnetization. In order to acquire a desired magnetic characteristic or crystal structure, the first ferromagnetic layer 20 may contain B, C, N, 0, Al, Si, P, S, Ti, V, Cr, Cu, Zn, Ga, Ge, or the like. Specific examples thereof include an Fe—Co alloy and an Fe—Co—B alloy. The first ferromagnetic layer 20 may be a multilayer film including a plurality of ferromagnetic layers. An example thereof is a multilayer film including an Fe—Co alloy and an Fe—Co—B alloy. The first ferromagnetic layer 20 may be a multilayer film including at least two ferromagnetic layers and at least one non-magnetic layer laminated one on another. An example thereof is a multilayer film in which Co and Pt are alternately laminated with a film thickness in the sub-nanometer range.

The barrier layer 30 includes an insulating material. Examples thereof include Mg—O and Al—O.

A material that may be used for the second ferromagnetic layer 41 or the third ferromagnetic layer 43 constituting the reference layer 40 is similar to that used for the first ferromagnetic layer 20. Note that the second ferromagnetic layer 41 and the third ferromagnetic layer 43 must be magnetically harder than the first ferromagnetic layer 20. The coupling layer 42 desirably includes a conductive material capable of magnetically coupling the second ferromagnetic layer 41 to the third ferromagnetic layer 43. A specific example thereof is Ru. An example membrane composition of the reference layer 40 is, from the side of the barrier layer 30, an Fe—Co—B alloy, Ta, a [Co/Pt] multilayer film, Ru, and a [Co/Pt] multilayer film in this order.

The cap layer 50 includes a conductive material. Examples thereof include Ta and Ru. The cap layer 50 may be a multilayer film in which a plurality of conductive materials are laminated one on another. A specific example is a Ta/Ru/Ta multilayer film.

Next, a size and a film thickness of the magnetic memory element 100 will be described with reference to FIG. 2A.

The heavy metal layer 10 has a shape extending in an X direction. A typical size of the heavy metal layer 10 that is foinied in a rectangular shape within an X-Y plane is described below. A width in a Y direction is 20 to 150 nm. A length in an X direction is 50 to 800 nm. Note that the heavy metal layer 10 may have a shape other than a rectangle.

Figure 8A:
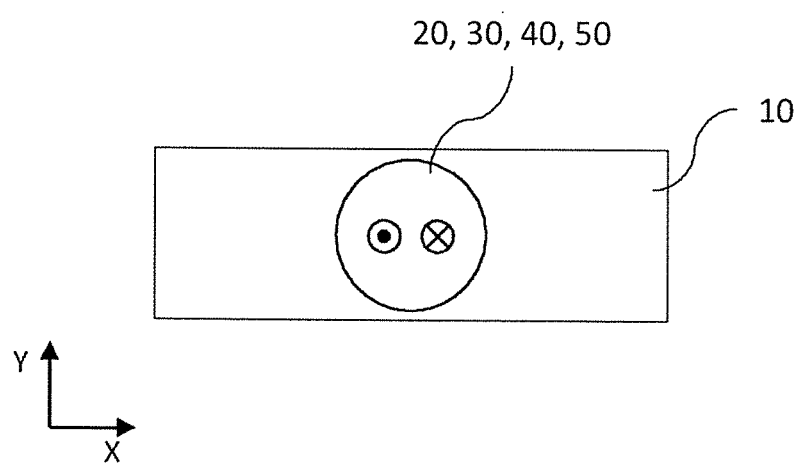
FIG. 8A is a plan view (X-Y plane) of a magnetic memory element according to a variation of the present disclosure.
Figure 8B:
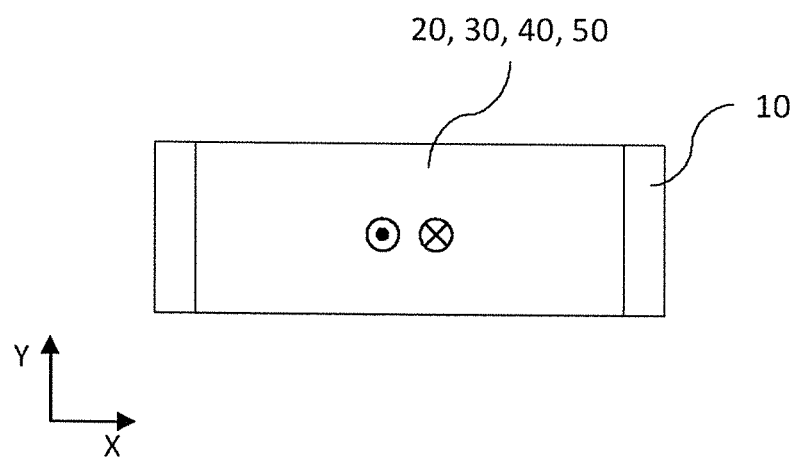
FIG. 8B is a plan view (X-Y plane) of a magnetic memory element according to a variation of the present disclosure.
Figure 8C:
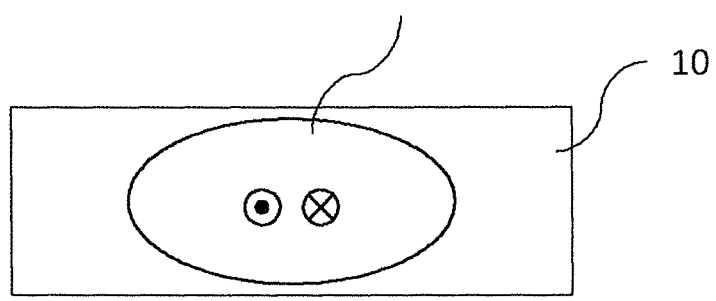
FIG. 8C is a plan view (X-Y plane) of a magnetic memory element according to a variation of the present disclosure.
Figure 8C:
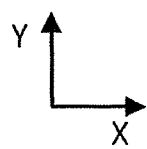
Figure 8D:
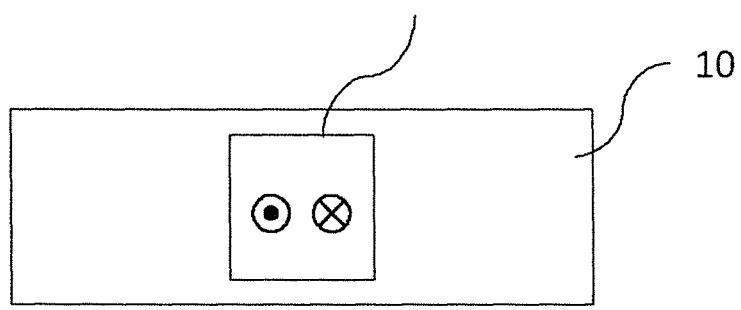
FIG. 8D is a plan view (X-Y plane) of a magnetic memory element according to a variation of the present disclosure.
Figure 8D:
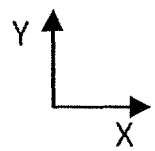

The first ferromagnetic layer 20, the barrier layer 30, the reference layer 40, and the cap layer 50 are formed in the same shape, as illustrated in FIG. 2A. Note that these layers need not have the same shape. For example, only the first ferromagnetic layer 20 may be formed in the same shape as the heavy metal layer 10. Any one of these layers may have any shape. While the layers each have a square shape in the example of FIG. 2A, the layers may have a circular shape (FIG. 8A), a rectangular shape (FIG. 8B), or an elliptical shape (FIG. 8C). A length of a side, a diameter or a short diameter in this case is 20 to 150 nm. Note that, while FIG. 2A illustrates an example in which a length of the first ferromagnetic layer 20, the barrier layer 30, the reference layer 40 or the cap layer 50 in a Y direction is the same as a length of the heavy metal layer 10 in a Y direction, a length may be different as illustrated in FIG. 8D.

Figure 9:
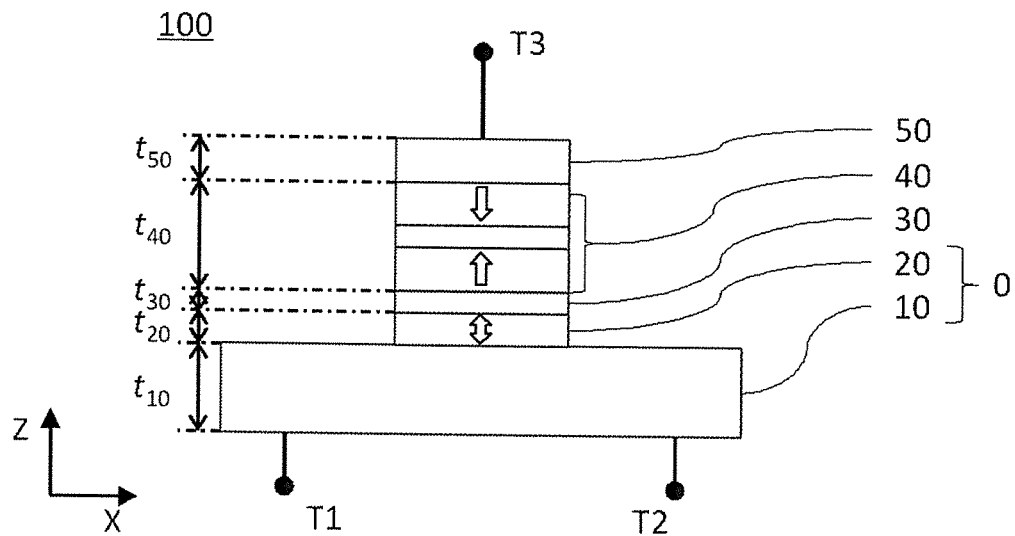
FIG. 9 illustrates a film thickness of the magnetic memory element of FIG. 2A.

A film thickness of each layer will be described with reference to FIG. 9.

A film thickness $t_{10}$ of the heavy metal layer 10 is desirably 6 nm or more and 20 nm or less. When a film thickness $t_{10}$ of the heavy metal layer 10 is less than 6 nm, it is impossible to ensure a sufficient process margin in a producing process described later. Setting a film thickness $t_{10}$ to 6 nm or more ensures a sufficient process margin. A film thickness $t_{10}$ of the heavy metal layer 10 exceeding 20 nm requires a large write current. The film thickness $t_{10}$ of the heavy metal layer 10 as used here refers to a film thickness of a portion, adjacent to the first ferromagnetic layer 20, of the heavy metal layer 10. In other words, the film thickness $t_{10}$ of the heavy metal layer 10 indicates a thickness of an area of the heavy metal layer 10 on which the first ferromagnetic layer 20 is formed.

A film thickness $t_{20}$ of the first ferromagnetic layer 20 is typically 0.8 nm or more and 10 nm or less.

A film thickness $t_{30}$ of the barrier layer 30 is typically 0.8 nm or more and 3 nm or less.

A total film thickness $t_{40}$ of the reference layer 40 is 2 nm or more and 15 nm or less.

A film thickness $t_{50}$ of the cap layer 50 is 1 nm or more and 50 nm or less.

(Producing Method)

Next, a method for producing the magnetic multilayer film 0 and the magnetic memory element 100 will be described. When the magnetic multilayer film 0 is produced, two processes are performed, that is, a film forming process of depositing a multilayer film on a substrate and an annealing process of heat-processing the formed multilayer film. Note that the annealing process is not mandatory.

A method for fomiing the magnetic multilayer film 0 will be described. A physical vapor deposition method may be used to form the magnetic multilayer film 0. A sputtering method is desirably used among the physical vapor deposition methods, and in particular a DC magnetron sputtering method is more desirably used. Note that methods other than a sputtering method are applicable, including a vacuum deposition method, a molecular beam epitaxy method, an electron beam deposition method, and a laser ablation method. As a sputtering method, an RF magnetron sputtering method may also be used.

An Si substrate coated with an amorphous material such as silicon oxide is used for a substrate on which the magnetic multilayer film 0 is formed. Note that, when the magnetic memory 300 or any other integrated circuit is formed by using the magnetic memory element 100 including the magnetic multilayer film 0, a substrate is used that includes a circuit in which a transistor or wiring is formed. A film may be formed at an arbitrary substrate temperature. Note that a substrate temperature is desirably cooled down below a room temperature, and more favorably, below 0° C. A bias voltage may be applied to a substrate. Applying a bias voltage to a substrate increases the effect of the present embodiment.

A process of depositing the heavy metal layer 10 in the use of a DC sputtering method will be detailed. It is desirable to exhaust a gas inside a film forming device so that the pressure inside the film forming device will drop to $10^{-6}$ Pa or less. A distance between a substrate and a target (a T/S distance) is set to 120 to 480 mm. An inert gas is introduced, as a sputtering gas, into the film forming device. A sputtering gas is, for example, argon (Ar). Krypton (Kr) or xenon (Xe) may be used instead of Ar. A gas flow rate is adjusted so that a partial pressure of an inert gas inside the film forming device will be 0.1 Pa or more. After the gas flow rate is stabilized, a high voltage is applied to a target and the target is sputtered with a sputtering gas to deposit a thin film on the substrate. An input power is adjusted so that a deposition rate of the thin film will be 0.02 nm/s or less.

Note that a partial pressure of an inert gas and a deposition rate of a thin film in a depositing process of the heavy metal layer 10 are important control parameters in the production of the magnetic multilayer film 0. In general, a relation $\lambda=0.01/P$ holds between a mean free path $\lambda$ (unit: cm) of a sputtered particle and a pressure P (unit: Torr) in a vacuum. According to an experiment conducted by the present inventors, a resistivity of the heavy metal layer 10 becomes 100 $\mu\Omega$ cm or more by setting a smaller value of $\mu$ than a T/S distance. This implements a magnetization reversal via a spin orbit torque with a small current density.

When the magnetic memory element 100 is produced, the barrier layer 30, the reference layer 40 and the cap layer 50 are deposited in addition to the magnetic multilayer film 0. The barrier layer 30 can be deposited by an RF sputtering method or the like.

In a process of forming the magnetic multilayer film 0 and the magnetic memory element 100, annealing takes place following deposition of a multilayer film or patterning. An annealing temperature is set within the range of 200° C. to 450° C. An annealing time is 15 minutes or more and 5 hours or less.

When the magnetic memory element 100 is formed, element processing is performed using a microfabrication technology after deposition of a multilayer film or after deposition of a multilayer film followed by annealing. Element processing starts with patterning of an MTJ portion, that is, the first ferromagnetic layer 20, the barrier layer 30 and the reference layer 40. A resist is coated on a substrate, the resist is patterned using a stepper or an electron beam lithography system, and the resist is developed to form a resist pattern on the substrate. A hard mask may be deposited as appropriate by using a chemical vapor deposition (CVD) method or the like before a resist is coated, and then a resist pattern may be transferred to the hard mask by using a reactive ion etching (RIE) method or the like. Subsequently, etching of a multilayer film takes place that will be formed into the magnetic memory element 100. Etching may use the RIE method or an ion beam etching (IBE) method. Etching is stopped desirably on a surface or in the middle of the heavy metal layer 10. Next, an insulating protective layer is formed by using the CVD method or the like, followed by patterning of the heavy metal layer 10. The patterning process will not be described since the same patterning process of an MTJ may be used. After patterning of the heavy metal layer 10, a via, upper wiring, and the like are formed.

Figure 10:
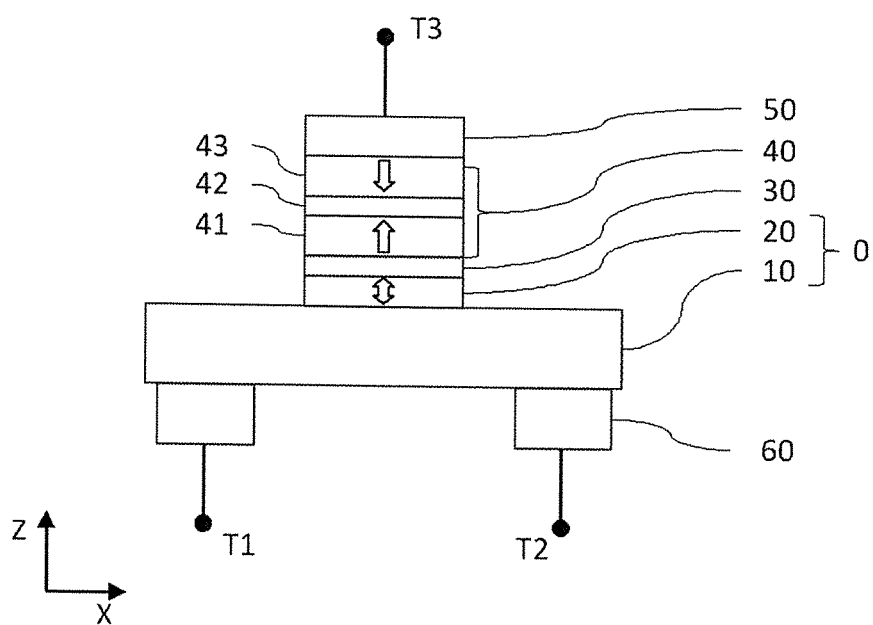
FIG. 10 is a front view (X-Z plane) of a magnetic memory element according to a variation of the present disclosure.

When the magnetic memory element 100 is formed, a film is deposited on a circuit substrate on which a transistor or wiring is formed, as mentioned above. The magnetic memory element 100 has, for example, a three-terminal type structure and the heavy metal layer 10 is electrically connected to the first terminal T1 and the second terminal T2. As illustrated in FIG. 10, a plug 60 may be formed as the first terminal T1 or the second terminal T2. When a top face of the plug 60 includes or contains W and the heavy metal layer 10 of the magnetic memory element 100 includes or contains W, an improved electrical connection is provided between the first terminal T1 or the second terminal T2 and the magnetic memory element 100. In other words, the present embodiment has an additional effect of improving an electrical connection between the first terminal T1 or the second terminal T2 and the magnetic memory element 100. Note that the film forming method of the heavy metal layer 10 mentioned above may be applied to a process of depositing a material of the first terminal T1 or the second terminal T2.

EXAMPLE

Figure 11A:
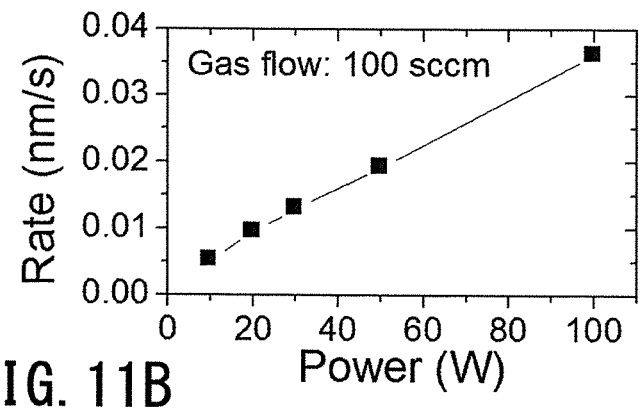
FIG. 11A illustrates an input power dependency and FIG. 11B illustrates a gas flow rate dependency and FIG. 11C illustrates a relation between a gas flow rate and a degree of vacuum and a relation between a gas flow rate and a mean free path of a sputtered particle.
Figure 11B:
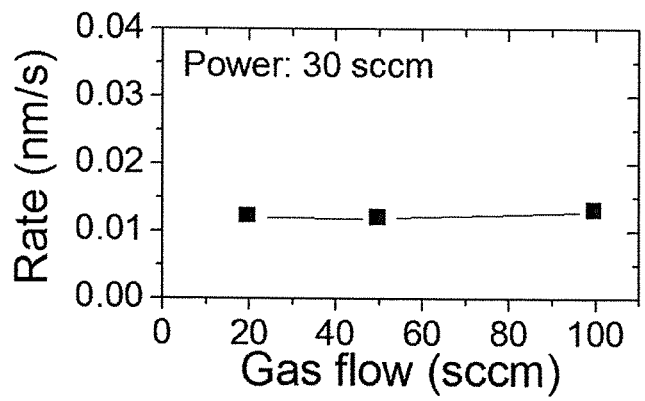
Figure 11C:
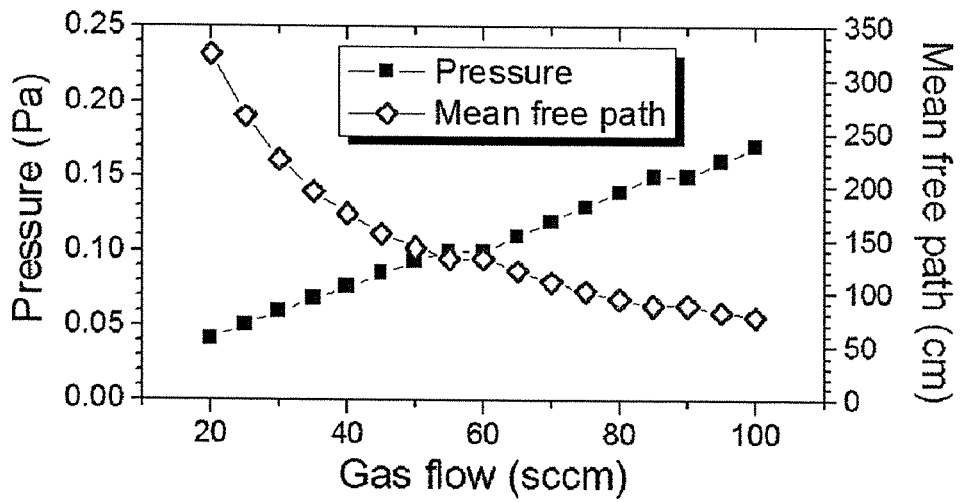

The following describes a result of an experiment conducted by the present inventors concerning the magnetic multilayer film 0 and the magnetic memory element 100. FIG. 11A illustrates a measurement result of a relation between a thin film deposition rate and an input power observed when W is used for the heavy metal layer 10 and Ar is used for a sputtering gas. It is to be understood that there is a proportional relation, to be exact, a substantially linear relation, between the input power and the deposition rate. FIG. 11B illustrates a measurement result of a relation between a thin film deposition rate and a flow rate of an Ar gas. It is to be understood that there is no correlation between the deposition rate and the flow rate. FIG. 11C illustrates a relation between a partial pressure of an Ar gas and a flow rate of an Ar gas. It is to be understood that there is a proportional relation between the partial pressure and the flow rate. A right axis scale in FIG. 11C indicates a mean free path value calculated by using the above formula. A T/S distance is set to 150 mm in a film forming device. It is to be understood that a gas flow rate of 50 sccm corresponds to a partial pressure of 0.1 Pa and a mean free path of 150 mm.

Figure 12A:
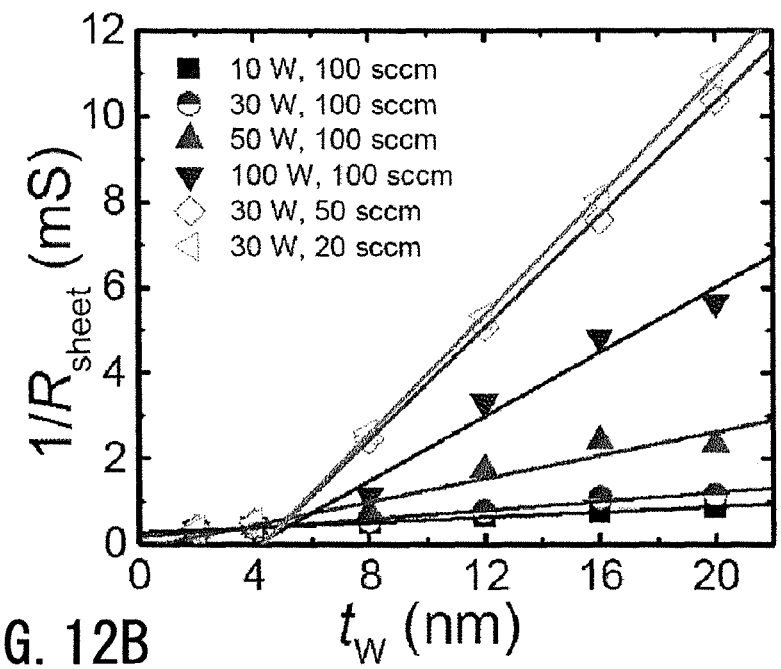
FIG. 12A is a graph illustrating a relation between a sputtering condition and a sheet resistance of W and FIG. 12B is a graph illustrating a relation between a sputtering condition and a resistivity of W.
Figure 12B:
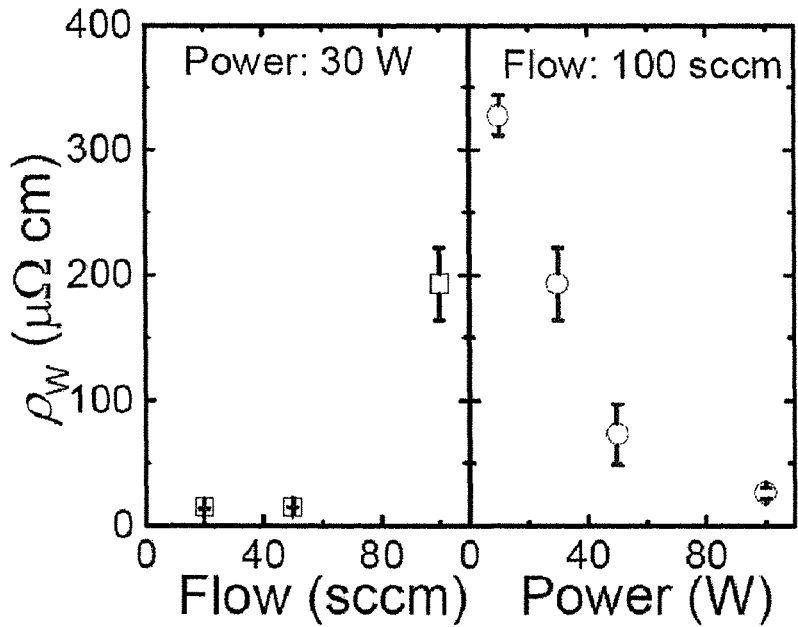

Next, a measurement result of a sheet resistance and a resistivity of the magnetic multilayer film 0 sputtering-formed using six combinations of an input power and a gas flow rate is illustrated in FIGS. 12A and 12B. An Si substrate with a natural oxide film is used. A membrane composition of the magnetic multilayer film 0 is, from the substrate side, W (tw), CoFeB (1), MgO (2), and Ta (1) in this order (a numeral in parentheses indicates a film thickness in nanometers). A sheet resistance is measured by a four-probe method.

FIG. 12A is a plot of an inverse of a measured sheet resistance $R_{sheet}$ versus a W film thickness tw. A resistivity is determined from an inclination of this graph. As illustrated in FIG. 12A, when a combination of an input power and a gas flow rate is (30 W, 20 sccm), (30 W, 50 sccm), (100 W, 100 sccm) or (50 W, 100 sccm), the inclination of the graph changes at a W film thickness of around 5 nm. This means that, a structure with a high resistivity, or an amorphous or a β-phase crystal structure, is formed for a film thickness of less than 5 nm, a structure with a low resistivity, or an α-phase crystal structure is formed for a film thickness of 5 nm or more. On the other hand, when a combination of an input power and a gas flow rate is (30 W, 100 sccm) or (10 W, 100 sccm), a small inclination of the graph is maintained even for a film thickness of 20 nm, which means that a structure with a high resistivity is attained even in a thick film range.

FIG. 12B illustrates, versus a film forming condition, a value of resistivity determined from an inclination of the graph in FIG. 12A in the range of a film thickness tw of the heavy metal layer 10 of 8 nm or more. It is to be understood that a resistivity varies dramatically depending on a film forming condition in the range of 10 μΩ cm to 325 μΩ cm.

Figure 13:
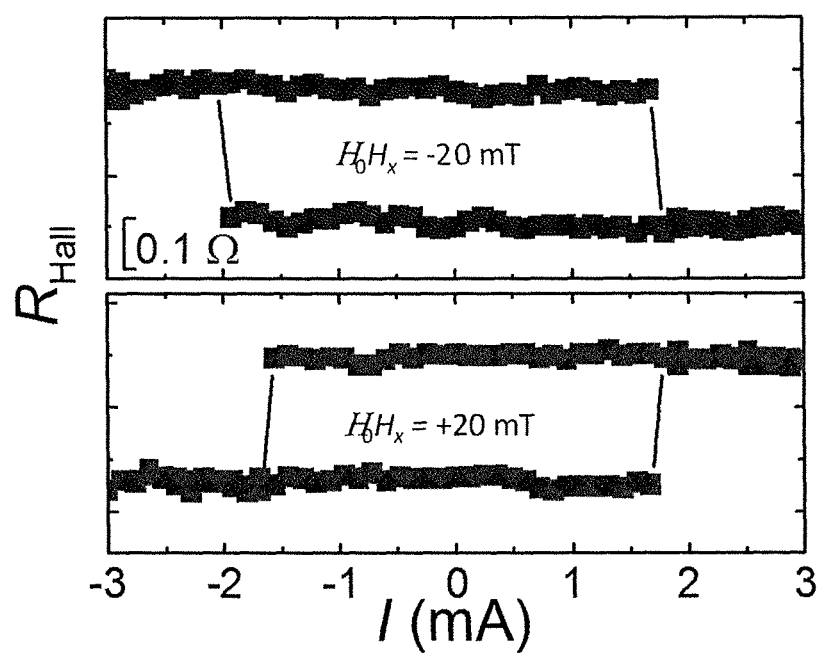
FIG. 13 illustrates a measurement result of a magnetization reversal by a spin orbit torque in a magnetic memory element that has been produced.

The following describes an evaluation result of a reversal characteristic of a magnetization reversal of the magnetic memory element 100 formed by using the magnetic multilayer film 0 deposited under the above conditions. Note that, in order to simply evaluate a magnetization reversal by a spin orbit torque, a measurement method using an anomalous Hall effect described in the literature "Applied Physics Letters, vol. 107, 012401 (2015)" is used in this evaluation process. The first ferromagnetic layer 20 is patterned in the shape of a dot 120 nm in diameter. In the measuring process, an external magnetic field $H_X$ of +20 mT or −20 mT is applied in an X direction. FIG. 13 illustrates a measurement result of a Hall resistance observed when a current is fed to the heavy metal layer 10. It is to be understood that a magnetization is reversed by the current and a Hall resistance is changed. A magnetization reversal direction is switched depending on a sign of $H_X$, and it is thus to be understood that a spin orbit torque drives reversal of a magnetization direction.

Figure 14A:
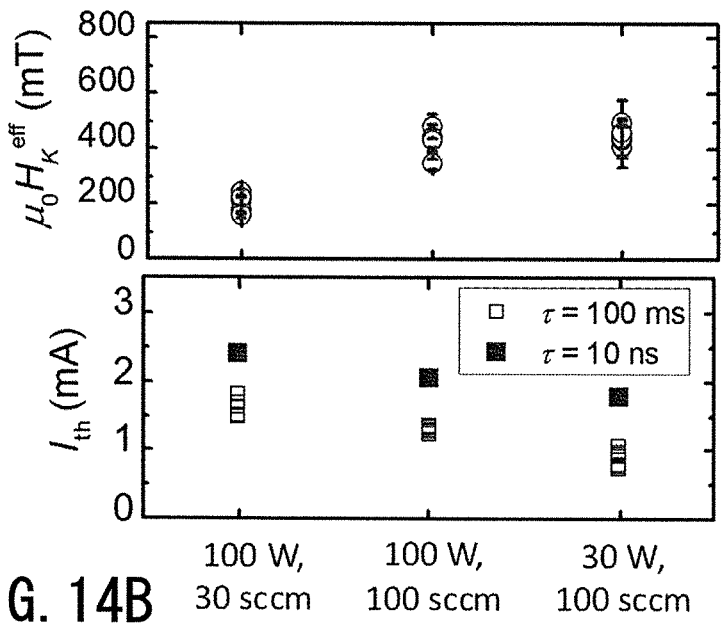
FIG. 14A illustrates a sputtering condition dependency of an effective anisotropy field and that of a threshold current and FIG. 14B illustrates a sputtering condition dependency of a magnetization reversal efficiency and FIG. 14C illustrates a relation between a magnetization reversal efficiency and a resistance of a heavy metal channel layer.
Figure 14B:
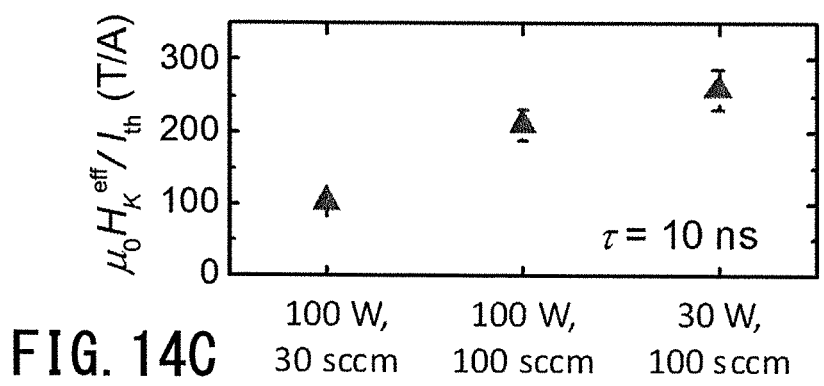
Figure 14C:
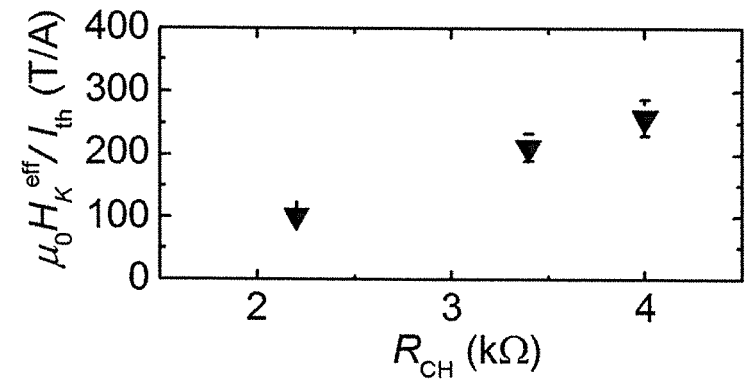

FIG. 14A is a plot of a separately measured anisotropy field $H_K^{eff}$ and a reversal threshold current $I_{th}$ versus a sputtering condition of W. A plurality of plots illustrated for a condition are measurement results obtained for a plurality of elements formed under the condition. The reversal threshold current $I_{th}$ is a value observed when a pulse width is 100 ms or 10 ns. FIG. 14B is a plot of a value obtained by dividing the anisotropy field by the reversal threshold current $I_{th}$ versus a sputtering condition. In this context, a value obtained by dividing the anisotropy field by the reversal threshold current $I_{th}$ reflects a magnitude of an efficiency of reversal of a magnetization direction by a spin orbit torque. When a spin orbit torque is caused by a spin Hall effect, this value reflects a magnitude of a spin Hall angle. It is to be understood that a value obtained by dividing the anisotropy field $H_K^{eff}$ by the reversal threshold current $I_{th}$ changes with a sputtering condition. FIG. 14C is a plot of a value obtained by dividing the anisotropy field $H_K^{eff}$ by the reversal threshold current $I_{th}$ versus a resistance of a channel layer including the heavy metal layer 10. In this context, the resistance of the channel layer is proportional to a resistivity of the heavy metal layer 10. It is to be understood that, as the resistance of the channel layer increases, that is, as the resistivity of the heavy metal layer 10 increases, a value obtained by dividing the anisotropy field $H_K^{eff}$ by the reversal threshold current $I_{th}$ increases monotonously, or in other words, a spin orbit torque becomes larger. It is to be understood, from the result given here, that a sputtering condition substantially changes an efficiency of reversal of a magnetization direction by a spin orbit torque. Note that, comparing $H_K^{eff}$ and $I_{th}$ in FIG. 14A with each other, a largest value of $H_K^{eff}$ is obtained under the condition (30 W, 100 sccm) where a smallest value of $I_{th}$ is obtained. It is thus to be understood that, in addition to reversal of a magnetization direction by a spin orbit torque with a small current, a high value of the anisotropy field $H_K^{eff}$, that is, a high thermal stability is obtained as a secondary effect.

As mentioned above, when forming a three-terminal element that reverses a magnetization direction by using a spin orbit torque, it is desirable to set a film thickness of the heavy metal layer 10 to 6 nm or more from the viewpoint of a process margin or the like. However, as understood from FIG. 12, there is a disadvantage: the heavy metal layer 10 obtained has a small resistivity when deposited in such a film thickness range under an ordinary sputtering condition, which fails to acquire a characteristic of reversal of a magnetization direction by a favorable spin orbit torque. Generally speaking, a high input power (a high deposition rate) and a low gas flow rate (a low partial gas pressure) are set for deposition of a thin film in a sputtering method. An examination by the present inventors has made clear that the heavy metal layer 10 having a resistivity of 100 μΩ cm or more can be formed even in a film thickness range of 6 nm or more, by setting a low deposition rate and a high partial gas pressure in a thin film depositing process, and that there is a correlation between a magnitude of a resistivity and an efficiency of reversal of a magnetization direction by a spin orbit torque.

Figure 15:
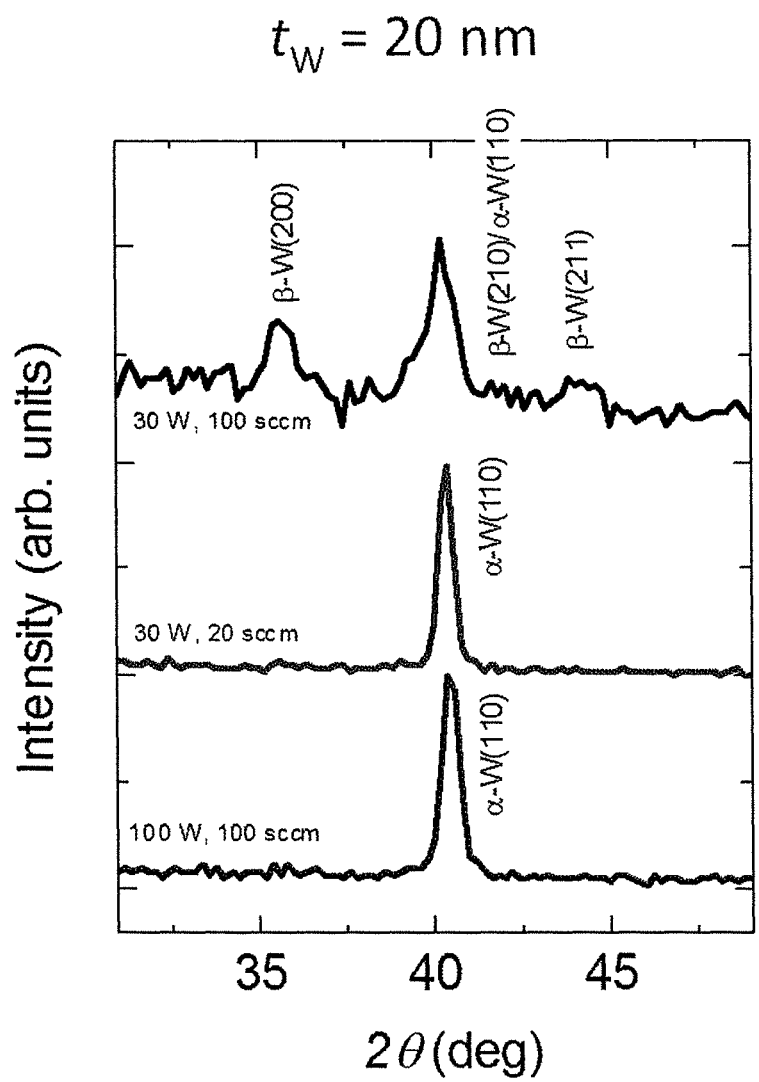
FIG. 15 illustrates an X-ray diffraction pattern of a magnetic multilayer film according to the present embodiment produced under a different condition.

FIG. 15 illustrates a result of an analysis, using an X-ray diffraction method, of a crystal structure of the magnetic multilayer film 0 deposited under a separate sputtering condition. An Si substrate with a natural oxide film is used. A membrane composition of the magnetic multilayer film 0 is, from the substrate side, W (20), CoFeB (1), MgO (2), and Ta (1) in this order (a numeral in parentheses indicates a film thickness in nanometers). It is to be understood that, when a combination of an input power and a gas flow rate used for W film formation is (30 W, 100 sccm), there is obtained a high efficiency of reversal of a magnetization direction by a high spin orbit torque, and that, in this case, a peak caused by a diffraction from a β-phase crystal plane is confirmed and a β-phase crystal structure is formed also for a film thickness of 20 nm. On the other hand, under a condition where a high efficiency of reversal of a magnetization direction by a high spin orbit torque is not obtained, a peak that indicates only a diffraction from an α-phase crystal plane is confirmed. In other words, it is to be understood that a β-phase crystal structure can be formed by depositing the heavy metal layer 10 even for a film thickness of 20 nm by using the producing method according to the present embodiment, thereby obtaining a high efficiency of reversal of a magnetization direction by a high spin orbit torque.

From the foregoing examples, it is confirmed that the present disclosure can provide a magnetic multilayer film that has a small write current and ensures a wide producing process margin, thus being applicable to a magnetic memory element, a magnetic memory element using the magnetic multilayer film, a magnetic memory, and a method for producing the same.

(Variation)

Next, variations of the magnetic multilayer film 0 and the magnetic memory element 100 will be described.

Figure 16A:
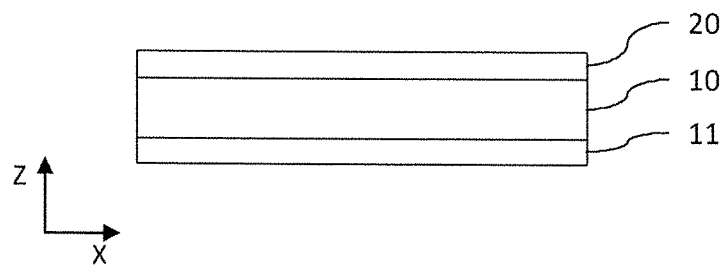
FIG. 16A is a front view of a magnetic multilayer film according to Variation 1 of the present disclosure and FIG. 16B is a front view of a magnetic multilayer film according to Variation 2 of the present disclosure.

While an example configuration has been described in which a conductive layer of the magnetic multilayer film 0 includes the heavy metal layer 10, a foundation layer 11 may be added in a conductive layer, as illustrated in FIG. 16A. In other words, the foundation layer 11 is arranged under the heavy metal layer 10, that is, on the opposite side of the first ferromagnetic layer 20. The foundation layer 11 can adjust a crystal structure of the heavy metal layer 10 so as to increase an efficiency of reversal of a magnetization direction by a spin orbit torque. In addition, the foundation layer 11 can facilitate formation of the magnetic memory element 100, as mentioned later.

The foundation layer 11 may use any conductive material. For example, the foundation layer 11 can use Ti, V, Cr, Zr, Nb, Mo, Hf, Ta, W, or the like, or an alloy thereof. The foundation layer 11 may include a structure in which a plurality of layers are laminated one on another, and the configuration may be adjusted as appropriate. A specific example configuration of the foundation layer 11 and the heavy metal layer 10 is Ta (7 nm)/W (3 nm).

Figure 16B:
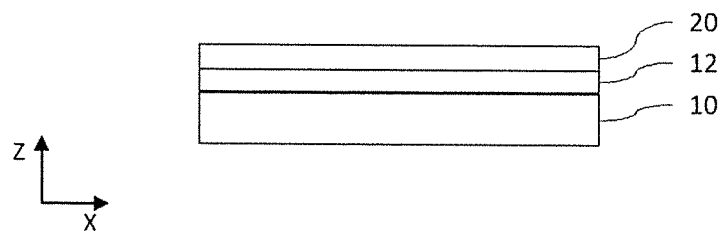

FIG. 16B illustrates a front view of a magnetic multilayer film 2 according to Variation 2. While a magnetic multilayer film 1 illustrated in FIG. 16A includes, as an adjustment layer, the foundation layer 11 under the heavy metal layer 10, an interface insertion layer 12 may be arranged as an adjustment layer between the heavy metal layer 10 and the first ferromagnetic layer 20, as illustrated in FIG. 16B. The interface insertion layer 12 can increase a spin mixing conductance between the first ferromagnetic layer 20 and the heavy metal layer 10 or apply a spin orbit torque caused by a spin-orbit interaction at an interface to the first ferromagnetic layer 20. The interface insertion layer 12 also may use any conductive material.

Note that, for the magnetic multilayer film 1, 2, a sum of a film thickness of a conductive layer (the heavy metal layer 10 and the foundation layer 11, or the interface insertion layer 12) is desirably set to 6 nm or more. This ensures a sufficient process margin.

Figure 17A:
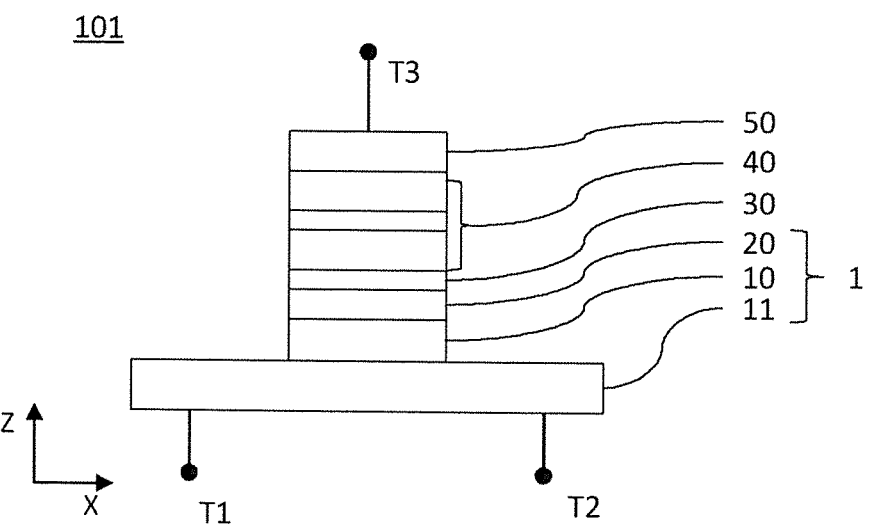
FIG. 17A is a front view of a magnetic memory element according to Variation 3 of the present disclosure and FIG. 17B is a front view of a magnetic memory element according to Variation 4 of the present disclosure.

As illustrated in FIG. 17A, a magnetic memory element 101 according to Variation 3 is related to the magnetic multilayer film 1 illustrated in FIG. 16A. The magnetic multilayer film 1 constituting the magnetic memory element 101 includes the foundation layer 11, the heavy metal layer 10, and the first ferromagnetic layer 20. The heavy metal layer 10 is formed in the same shape as the first ferromagnetic layer 20, the barrier layer 30, the reference layer 40, or the cap layer 50 formed thereon. For this structure, etching is stopped on the surface or in the middle of the foundation layer 11. By employing the aforementioned structure of the magnetic memory element 101, it is easy to detect an end point of etching. Another advantage is: a surface of a material used for the heavy metal layer 10 is prevented from being exposed to the atmosphere thus providing a wide range of choices of a material used for the heavy metal layer 10. For example, an experiment conducted by the present inventors has revealed that a poor resistance of an element frequents when W is exposed to the atmosphere and processing is made by using an organic solvent or the like. Use of the aforementioned configuration of the magnetic memory element 101, that is, a configuration in which Ta is used for the foundation layer 11, has been found to solve this problem.

Figure 17B:
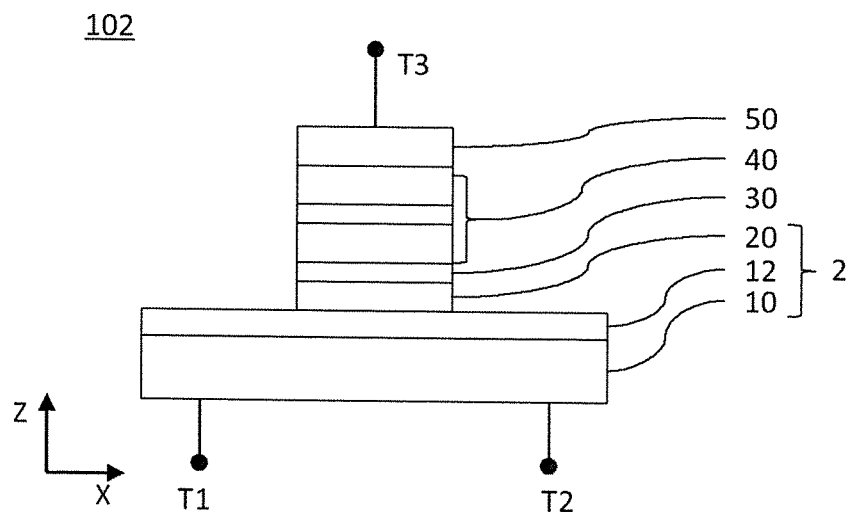

As illustrated in FIG. 17B, a magnetic memory element 102 according to Variation 4 is related to the magnetic multilayer film 2 illustrated in FIG. 16B. The magnetic multilayer film 2 constituting the magnetic memory element 102 includes the magnetic heavy metal layer 10, the interface insertion layer 12, and the first ferromagnetic layer 20. The interface insertion layer 12 is formed in the same shape as the heavy metal layer 10. For this structure, etching is stopped on the surface or in the middle of the interface insertion layer 12. By employing this structure of the magnetic memory element 102, it is easy to detect an end point of etching. Another advantage is that, as in FIG. 17B, a surface of a material used for the heavy metal layer 10 is prevented from being exposed to the atmosphere thus providing a wide range of choices of a material used for the heavy metal layer 10. Note that the interface insertion layer 12 must to be thin enough for a spin orbit torque generated by the heavy metal layer 10 to reach the first ferromagnetic layer 20.

Embodiment 2

Figure 18A:
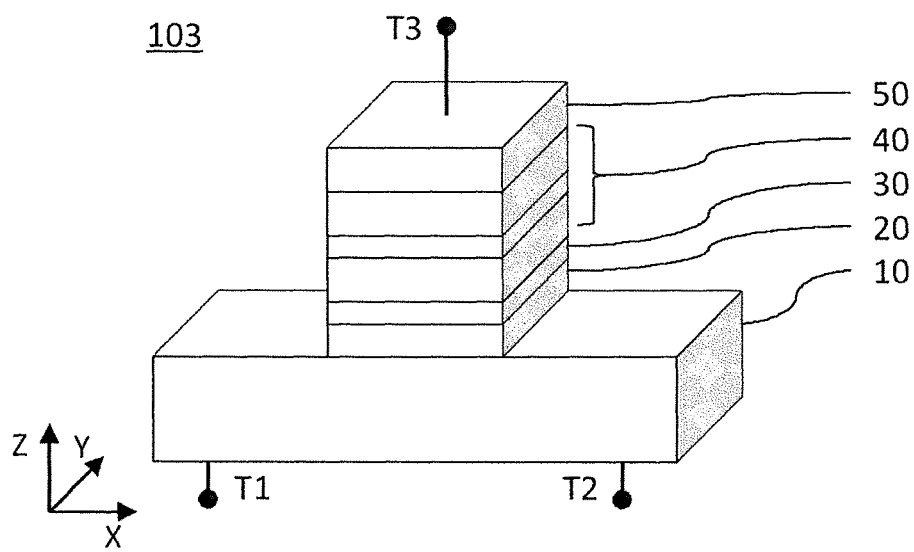
FIG. 18A is a perspective view of a magnetic memory element according to Embodiment 2 of the present disclosure.
Figure 18B:
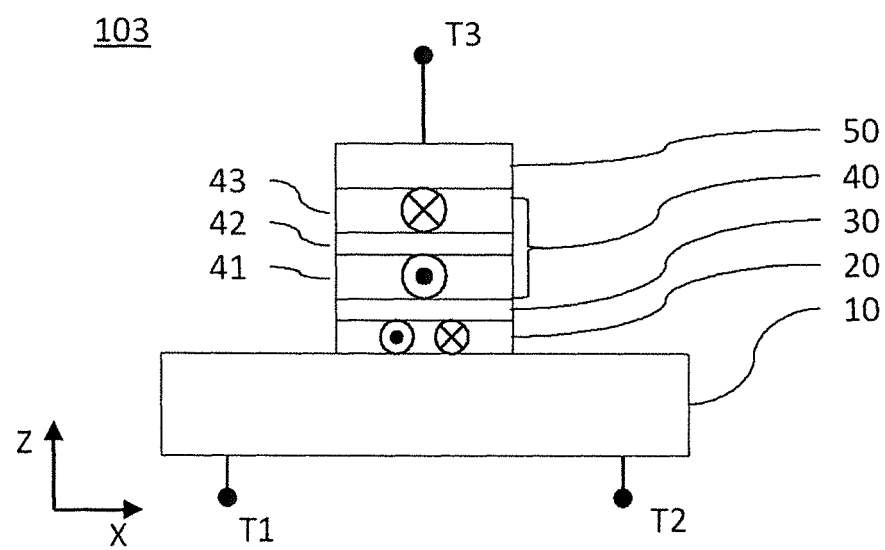
FIG. 18B is a front view (X-Z plane) of the magnetic memory element of FIG. 18A.
Figure 18C:
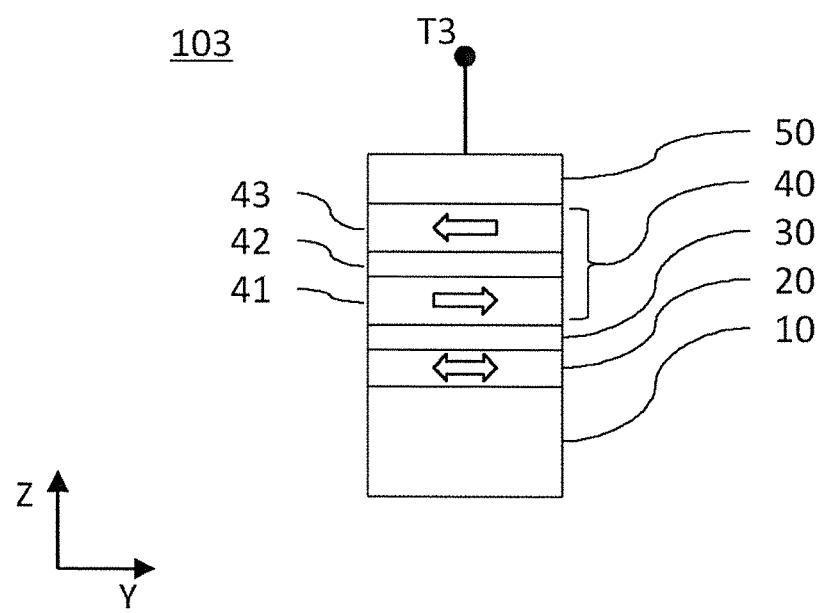
FIG. 18C is a side view (Y-Z plane) of the magnetic memory element of FIG. 18A.
Figure 18D:
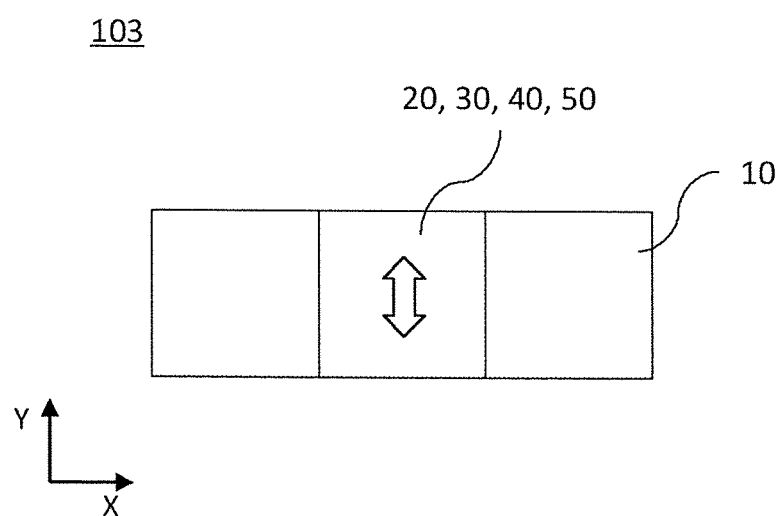
FIG. 18D is a plan view (X-Y plane) of the magnetic memory element of FIG. 18A.

FIG. 18A is a schematic view of a magnetic memory element 103 according to Embodiment 2 of the present disclosure. A front view (X-Z plane), a side view (Y-Z plane) and a plan view (X-Y plane) of the magnetic memory element 103 are illustrated respectively in FIG. 18B, FIG. 18C and FIG. 18D.

The magnetic memory element 103 includes, like the magnetic memory element 100, a magnetic multilayer film 0, a barrier layer 30, a reference layer 40 and a cap layer 50 that are laminated in this order, and further includes a first terminal T1, a second terminal T2, and a third terminal T3. Preferably, the magnetic multilayer film 0 is formed by being stretched in an X direction. The first terminal T1 is connected to one end of the magnetic multilayer film 0 and the second terminal T2 is connected to the other end of the magnetic multilayer film 0. The first terminal T1 and the second terminal T2 are connected to a heavy metal layer 10 of the magnetic multilayer film 0.

A difference between the magnetic memory element 103 and the magnetic memory element 100 is in a magnetization direction of a first ferromagnetic layer 20. The first ferromagnetic layer 20 of the magnetic memory element 103 has a reversible magnetization. A direction of the reversible magnetization is oriented in a direction orthogonal to a longitudinal direction of the heavy metal layer 10 and is reversible between a +Y direction and a −Y direction in the illustrated X-Y-Z orthogonal coordinate system. In other words, a magnetization direction of the first ferromagnetic layer 20 is reversible between directions orthogonal to a line segment connecting the first terminal and the second terminal within a film surface.

Accordingly, a magnetization direction of a ferromagnetic layer constituting the reference layer 40 is fixed in either the +Y direction or the −Y direction.

Other requirements related to an arrangement of the barrier layer 30, the heavy metal layer 10, the cap layer 50, and the terminals are similar to the requirements of the magnetic memory element 100.

For a memory state, unlike the magnetic memory element 100, a state in which the magnetization direction is oriented in the +Y direction is set as a magnetization direction in a state in which "0" is stored, and a state in which the magnetization direction is oriented in the −Y direction is set as a state in which "1" is stored.

A method for writing information is the same as that used for the magnetic memory element 100. Note that an external magnetic field in a +X direction or a −X direction that is required by the magnetic memory element 100 is not required by the magnetic memory element 103.

A method for reading information is the same as that used for the magnetic memory element 100.

A cell circuit and a circuit block diagram are the same as those of the magnetic memory element 100.

Figure 19:
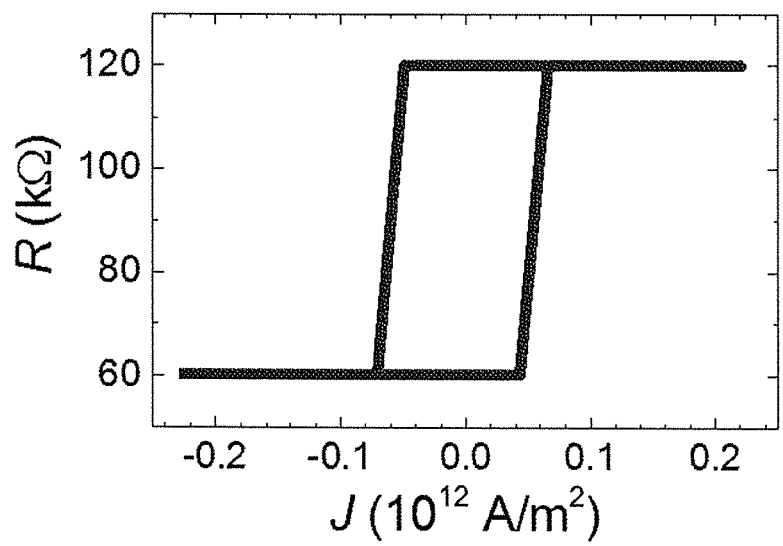
FIG. 19 illustrates a measurement result of the magnetic memory element of FIG. 18A.

FIG. 19 illustrates a relation between an MTJ resistance and a current density obtained by measuring the magnetic memory element 103 produced by the present inventors. A membrane composition used is, from the substrate side, Ta (7), W (3), CoFeB (1.46), MgO (1.8), CoFeB (1.5), Co (0.92), Ru (0.9), Co (2.6), and Ru (5) in this order. W (3 nm) corresponds to the heavy metal layer 10, CoFeB (1.46 nm) corresponds to the first ferromagnetic layer 20, MgO (1.8 nm) corresponds to the barrier layer 30, and CoFeB (1.5), Co (0.92), Ru (0.9) and Co (2.6) correspond to the reference layer 40, and Ru (5 nm) corresponds to the cap layer. Ta (7) corresponds to a foundation layer 11. In other words, a variation illustrating the magnetic memory element 103 is applied in the present embodiment.

A measurement result of a plurality of elements has proved that a magnetization is reversed at an extremely low current density of $(3.2 \pm 1.3) \times 10^{10}$ A/m$^2$. Note that W of the heavy metal layer 10 in this case is confirmed to have a structure with a high resistivity.

Embodiment 3

Figure 20A:
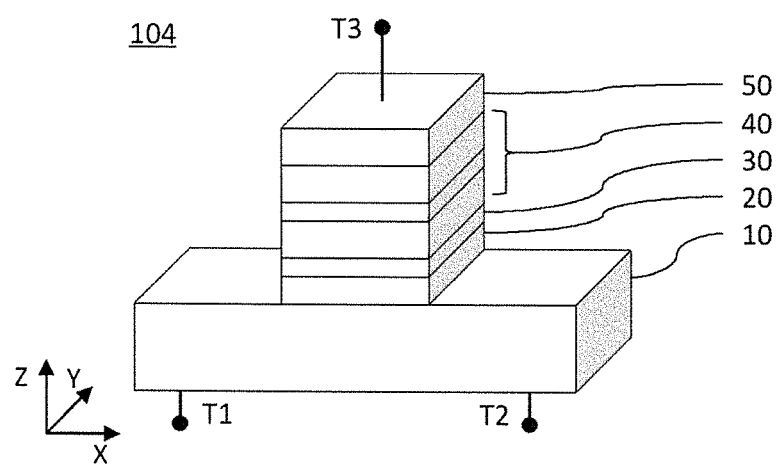
FIG. 20A is a perspective view of a magnetic memory element according to Embodiment 3 of the present disclosure.
Figure 20B:
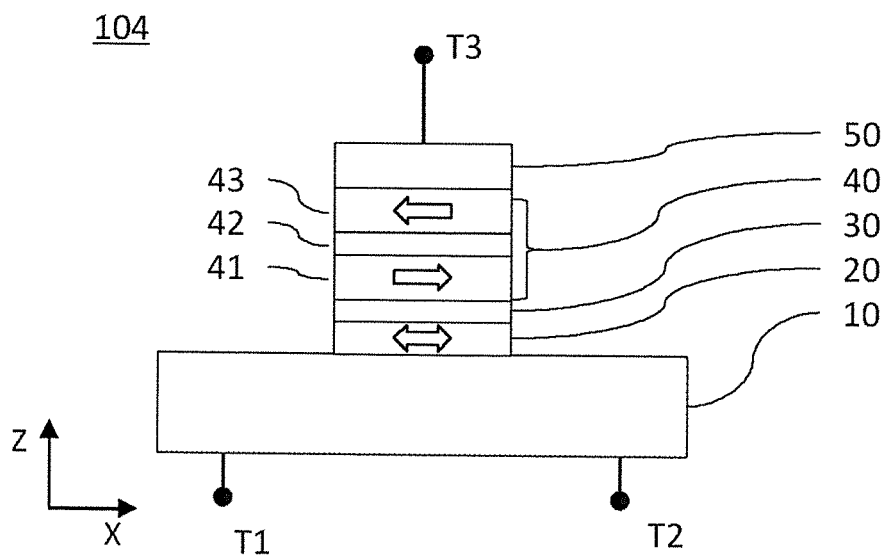
FIG. 20B is a front view (X-Z plane) of the magnetic memory element of FIG. 20A.
Figure 20C:
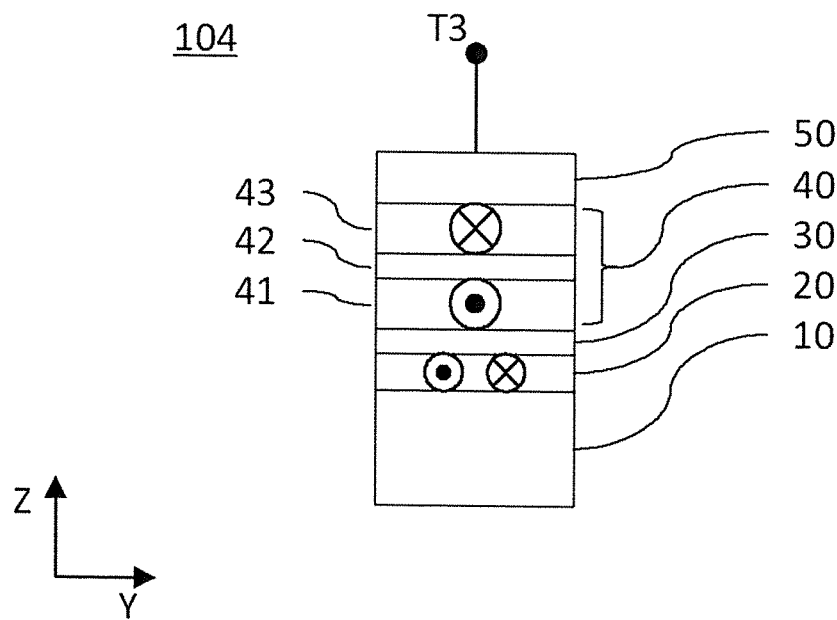
FIG. 20C is a side view (Y-Z plane) of the magnetic memory element of FIG. 20A.
Figure 20D:
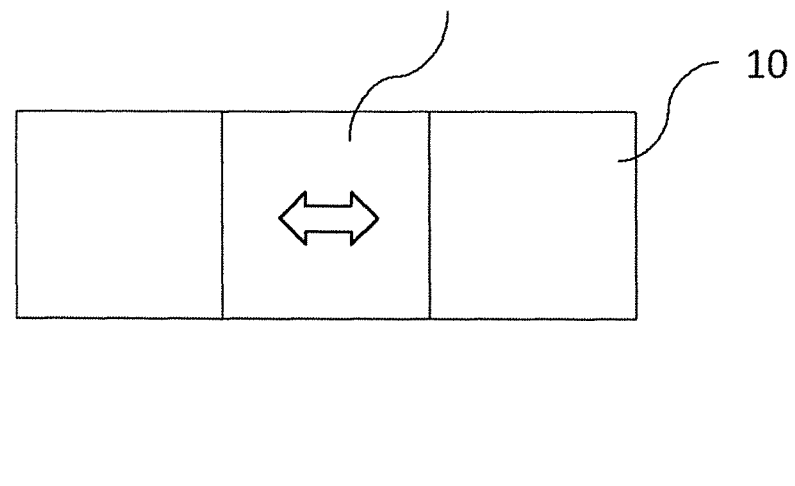
FIG. 20D is a plan view (X-Y plane) of the magnetic memory element of FIG. 20A.

FIG. 20A is a schematic view of a magnetic memory element 104 according to Embodiment 3 of the present disclosure. A front view (X-Z plane), a side view (Y-Z plane) and a plan view (X-Y plane) of the magnetic memory element 104 are illustrated respectively in FIG. 20B, FIG. 20C and FIG. 20D.

The magnetic memory element 104 includes, like the magnetic memory element 100, a magnetic multilayer film 0, a barrier layer 30, a reference layer 40 and a cap layer 50 that are laminated in this order, and further includes a first terminal T1, a second terminal T2, and a third terminal T3. Preferably, the magnetic multilayer film 0 is formed by being stretched in an X direction. The first terminal T1 is connected to one end of the magnetic multilayer film 0 and the second terminal T2 is connected to the other end of the magnetic multilayer film 0. The first terminal T1 and the second terminal T2 are connected to a heavy metal layer 10 of the magnetic multilayer film 0.

A difference between the magnetic memory element 104 and the magnetic memory element 100 is, likewise, in a magnetization direction of a first ferromagnetic layer 20. The first ferromagnetic layer 20 of the magnetic memory element 104 has a reversible magnetization. A direction of the reversible magnetization is oriented in a direction parallel to a longitudinal direction of the heavy metal layer 10 and is reversible between a +X direction and a −X direction in the illustrated X-Y-Z orthogonal coordinate system. In other words, a magnetization direction of the first ferromagnetic layer 20 is reversible between directions parallel to a line segment connecting the first terminal and the second terminal within a film surface.

Accordingly, a magnetization direction of a ferromagnetic layer constituting the reference layer 40 is fixed in either the +X direction or the −X direction.

Other requirements related to an arrangement of the barrier layer 30, the heavy metal layer 10, the cap layer 50, and the terminals are similar to the requirements of the magnetic memory element 100.

For a memory state, unlike the magnetic memory element 100, a state in which the magnetization direction is oriented in the +X direction is set as a magnetization direction in a state in which "0" is stored, and a state in which the magnetization direction is oriented in the −X direction is set as a state in which "1" is stored.

A method for writing information is the same as that used for the magnetic memory element 100. Note that, while an external magnetic field in a +X direction or a −X direction is required by the magnetic memory element 100, an external magnetic field in a +Z direction or a −Z direction is required by the magnetic memory element 104.

A method for reading information is the same as that used for the magnetic memory element 100.

A cell circuit and a circuit block diagram are the same as those of the magnetic memory element 100.

Figure 21A:
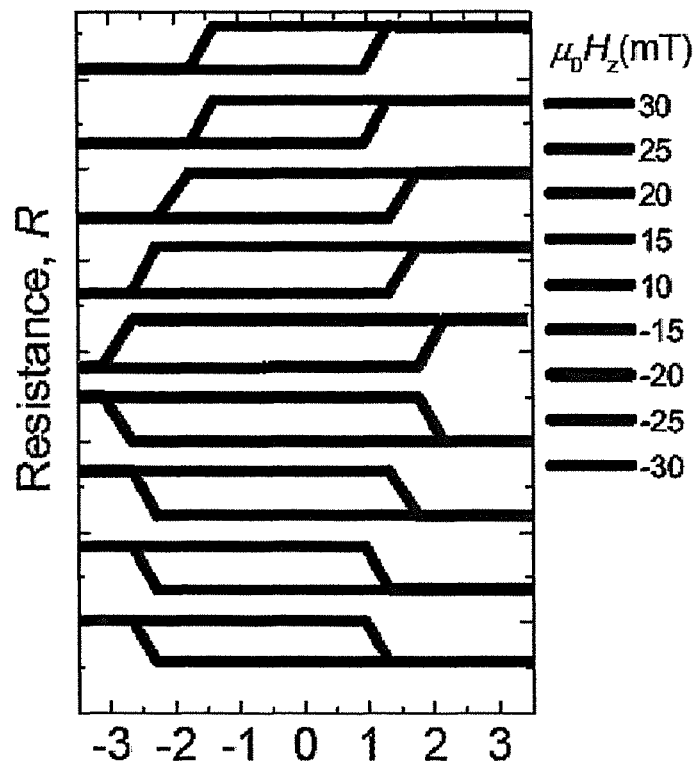
FIG. 21A illustrates a measurement result of a relation between an MTJ resistance and a current density of the magnetic memory element of FIG. 20A

FIG. 21A illustrates a relation between an MTJ resistance and a current density obtained by measuring the magnetic memory element 104 produced by the present inventors. Illustrated is a measurement result in a state in which a Z-direction magnetic field Hz of any one of a variety of magnitudes is applied. A membrane composition used is, from the substrate side, Ta (7), W (3), CoFeB (1.46), MgO (1.8), CoFeB (1.5), Co (0.92), Ru (0.9), Co (2.6), and Ru (5) in this order. W (3 nm) corresponds to the heavy metal layer 10, CoFeB (1.46 nm) corresponds to the first ferromagnetic layer 20, MgO (1.8 nm) corresponds to the barrier layer 30, and CoFeB (1.5), Co (0.92), Ru (0.9) and Co (2.6) correspond to the reference layer 40, and Ru (5 nm) corresponds to the cap layer. A magnetization reversal direction is switched depending on a sign of $H_Z$, which indicates that a magnetization reversal is induced by a spin orbit torque.

Figure 21B:
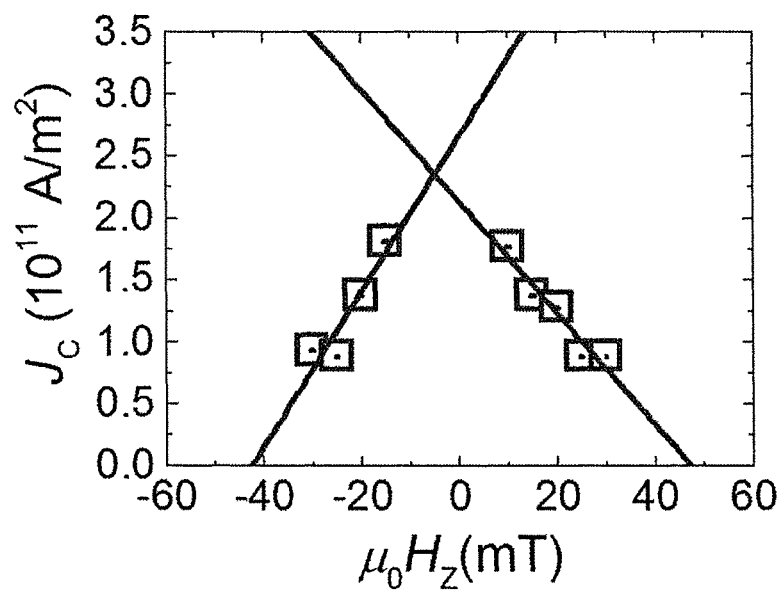
FIG. 21B illustrates a result of plotting, versus Hz, of a threshold current density of the magnetic memory element of FIG. 20A.

FIG. 21B illustrates a result of plotting of a threshold current density versus $H_Z$. A measurement result in a case where $H_Z$ is positive or a case where $H_Z$ is negative is fit with a linear function, and a value $J_C^0$ of $J_C$ at an intersection of the linear functions was evaluated for a plurality of elements. As a result, it has been found that a magnetization direction is reversed at an extremely small current density $J_C^0$ of $(2.1 \pm 0.5) \times 10^{11}$ A/m². Note that W of the heavy metal layer 10 in this context is confirmed to have a structure with a high resistivity.

Embodiment 4

Figure 22A:
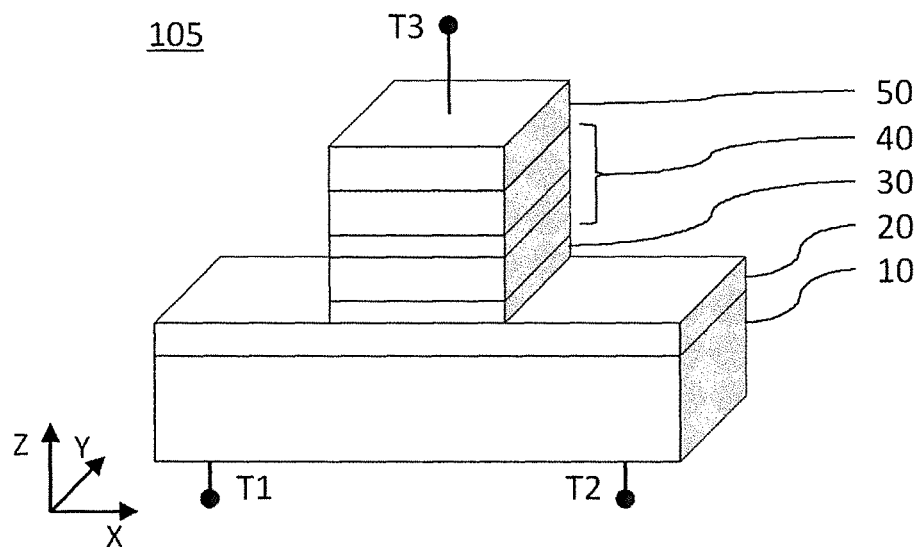
FIG. 22A is a perspective view of a magnetic memory element according to Embodiment 4 of the present disclosure.
Figure 22B:
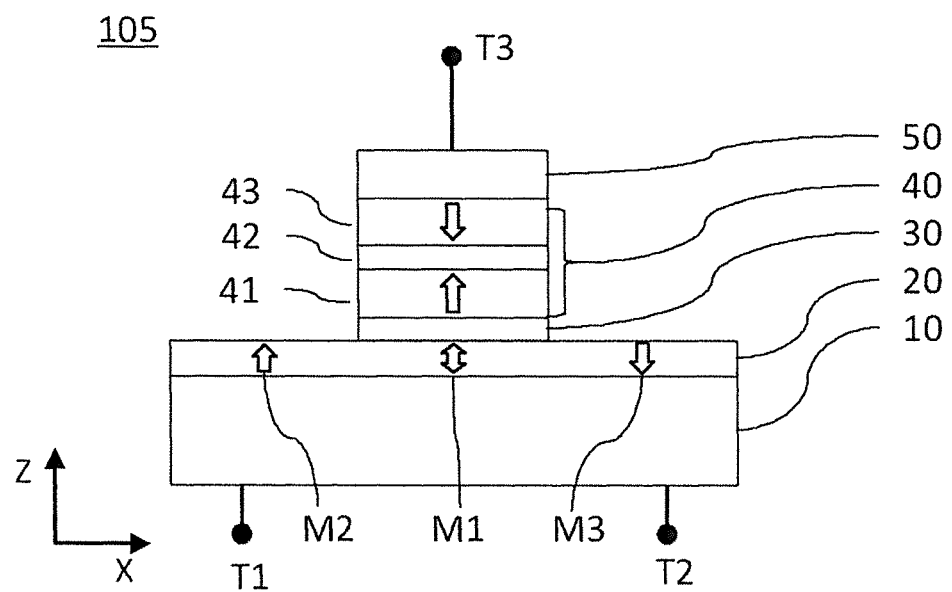
FIG. 22B is a front view (X-Z plane) of the magnetic memory element of FIG. 22A.
Figure 22C:
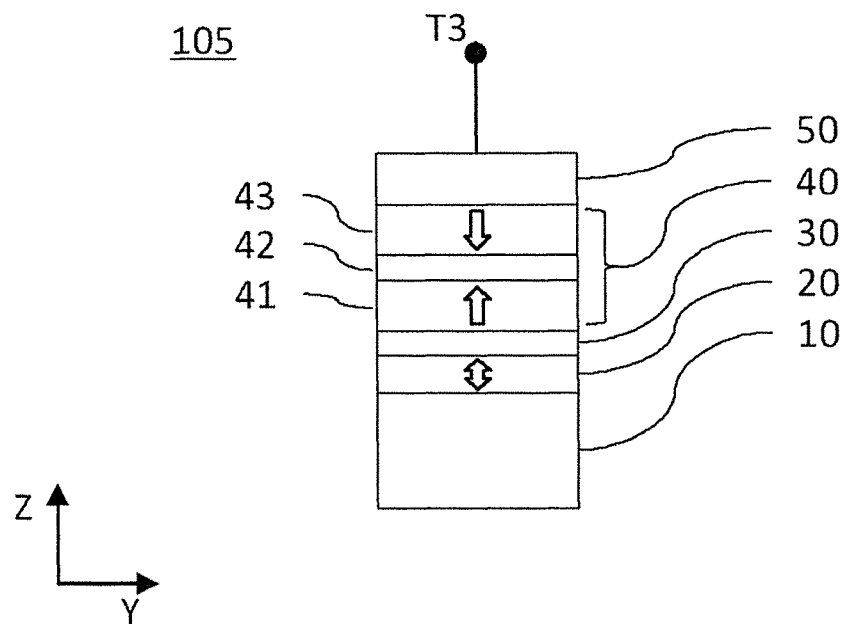
FIG. 22C is a side view (Y-Z plane) of the magnetic memory element of FIG. 22A.
Figure 22D:
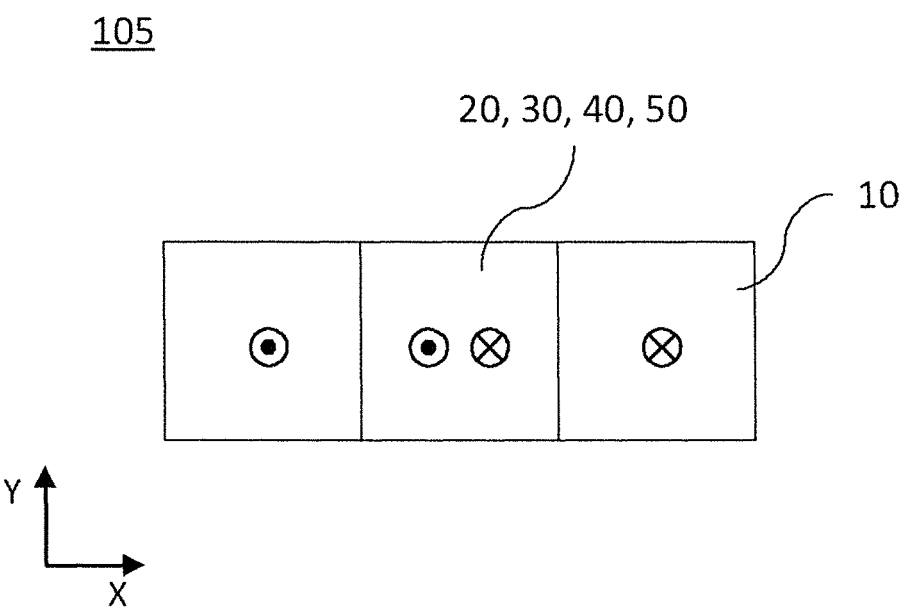
FIG. 22D is a plan view (X-Y plane) of the magnetic memory element of FIG. 22A.

FIG. 22A is a perspective view of a magnetic memory element 105 according to Embodiment 4 of the present disclosure. A front view (X-Z plane), a side view (Y-Z plane) and a plan view (X-Y plane) of the magnetic memory element 105 are illustrated respectively in FIG. 22B, FIG. 22C and FIG. 22D.

The magnetic memory element 105 includes, like the magnetic memory element 100, a magnetic multilayer film 0, a barrier layer 30, a reference layer 40 and a cap layer 50 that are laminated in this order, and further includes a first terminal T1, a second terminal T2, and a third terminal T3. Preferably, the magnetic multilayer film 0 is formed by being stretched in an X direction. The first terminal T1 is connected to one end of the magnetic multilayer film 0 and the second terminal T2 is connected to the other end of the magnetic multilayer film 0. The first terminal T1 and the second terminal T2 are connected to a heavy metal layer 10 of the magnetic multilayer film 0.

A difference between the magnetic memory element 105 and the magnetic memory element 100 is in a configuration of a magnetized area in a first ferromagnetic layer 20. A magnetization direction in the first ferromagnetic layer 20 is oriented in a substantially identical direction in the magnetic memory element 100. In the magnetic memory element 105, at least three magnetized areas are provided: a first magnetized area M1 in which a magnetization direction is reversible, and a second magnetized area M2 and a third magnetized area M3 arranged across the first magnetized area M1. A magnetization direction of the second magnetized area M2 and that of the third magnetized area M3 are fixed in mutually different directions and a magnetization direction of the first magnetized area M1 is designed to be reversible and to be capable of being oriented in the same direction as any one of a magnetization direction of the second magnetized area M2 and that of the third magnetized area M3. Accordingly, a single magnetic domain wall is formed in the first ferromagnetic layer 20. In the magnetic memory element 105, a magnetization direction of the second magnetized area M2 is fixed in a +Z direction, that of the third magnetized area M3 is fixed in a −Z direction, and that of the first magnetized area M1 can be oriented in any one of the +Z direction and the −Z direction.

Other requirements related to an arrangement of the barrier layer 30, the reference layer 40, the heavy metal layer 10, the cap layer 50, and the terminals are similar to the requirements of the magnetic memory element 100.

For a memory state, a magnetization direction of the first ferromagnetic layer 20 in the magnetic memory element 100 corresponding to a state in which "0" is stored or a state in which "1" is stored is replaced with a magnetization direction of the first magnetized area M1 in the first ferromagnetic layer 20.

A method for writing information is the same as that used for the magnetic memory element 100. Note that, while the magnetic memory element 100, 103, or 104 uses, as a principle of writing information, a magnetization direction reversal caused by rotation of a magnetization by a spin orbit torque, the magnetic memory element 105 uses a current-induced domain wall displacement in which a magnetic domain wall is moved by a current. What drives a current-induced domain wall displacement is a spin orbit torque. While the magnetic memory element 100 requires an external magnetic field in a +X or a −X direction, the magnetic memory element 105 does not require an external magnetic field.

A method for reading information is the same as that used for the magnetic memory element 100.

A cell circuit and a circuit block diagram are the same as those of the magnetic memory element 100.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of the Japanese Patent Application No. 2016-112242 filed on Jun. 3, 2016, the entire disclosure of which is incorporated by reference herein.

INDUSTRIAL APPLICABILITY

As described above, according to the present disclosure, it is possible to provide a magnetic, multilayer film, a magnetic memory element, a magnetic memory, and a method for producing the same.

REFERENCE SIGNS LIST 0-2 Magnetic multilayer film
10 Heavy metal layer
11 Foundation layer
12 Interface insertion layer
20 First ferromagnetic layer
30 Barrier layer
40 Reference layer
41 Second ferromagnetic layer
42 Coupling layer
43 Third ferromagnetic layer
50 Cap layer
60 Plug
100-105 Magnetic memory element
120 X-driver
130 Y-driver
140 Controller
200 Magnetic memory cell circuit
210 Magnetic memory cell array
300 Magnetic memory

The invention claimed is:

1. A magnetic multilayer film for a magnetic memory element, the magnetic multilayer film comprising:
   a conductive layer that includes a heavy metal layer containing a 5d transition metal; and
   a first ferromagnetic layer that is adjacent to the conductive layer and contains a ferromagnetic layer having a reversible magnetization,
   wherein
   a film thickness of the conductive layer is 6 nm or more, and
   a crystal structure of the heavy metal layer is amorphous or β-phase.

2. A magnetic multilayer film for a magnetic memory element, the magnetic multilayer film comprising:
   a conductive layer that includes a heavy metal layer containing a 5d transition metal; and
   a first ferromagnetic layer that is adjacent to the conductive layer and contains a ferromagnetic layer having a reversible magnetization,
   wherein
   a film thickness of the conductive layer is 6 nm or more, and
   a resistivity of the heavy metal layer is 100 μΩ cm or more.

3. The magnetic multilayer film according to claim 2, wherein a crystal structure of the heavy metal layer is amorphous or β-phase.

4. The magnetic multilayer film according to claim 1, wherein the conductive layer further includes an adjustment layer that is adjacent to the heavy metal layer and that includes a conductive material.

5. The magnetic multilayer film according to claim 1, wherein the heavy metal layer contains Ta or W.

6. A magnetic memory element, comprising:
   the magnetic multilayer film according to claim 1;
   a barrier layer that is adjacent to the first ferromagnetic layer and includes an insulating material;
   a reference layer that is adjacent to the barrier layer and includes at least one ferromagnetic layer having a fixed magnetization direction;
   a cap layer that is adjacent to the reference layer and includes a conductive material;
   a first terminal that is capable of introducing a current into one end of the heavy metal layer in the longitudinal direction;
   a second terminal that is capable of introducing a current into the other end of the heavy metal layer in the longitudinal direction; and
   a third terminal that is capable of introducing a current into the cap layer.

7. The magnetic memory element according to claim 6, comprising a fourth terminal connected to the first ferromagnetic layer.

8. The magnetic memory element according to claim 6, wherein the first ferromagnetic layer has a reversible magnetization in a direction perpendicular to a film surface of the first ferromagnetic layer.

9. The magnetic memory element according to claim 6, wherein the first ferromagnetic layer has a reversible magnetization in a direction orthogonal to a line segment connecting the first terminal and the second terminal within a film surface of the first ferromagnetic layer.

10. The magnetic memory element according to claim 6, wherein the first ferromagnetic layer has a reversible magnetization in a direction parallel to a line segment connecting the first terminal and the second terminal within a film surface of the first ferromagnetic layer.

11. The magnetic memory element according to claim 6, wherein
   the first ferromagnetic layer includes a first magnetized area, and a second magnetized area and a third magnetized area arranged across the first magnetized area,
   a magnetization of the second magnetized area and a magnetization of the third magnetized area are fixed in mutually different directions, and
   a magnetization of the first magnetized area is reversible and can be oriented in the same direction as any one of a magnetization of the second magnetized area and a magnetization of the third magnetized area.

12. A magnetic memory, comprising:
   the magnetic memory element according to any of claim 6;
   write means for writing data to the magnetic memory element by feeding a write current to the magnetic memory element; and
   read means for reading data written into the magnetic memory element by determining a tunnel resistance by feeding a current in a direction penetrating the barrier layer.

13. The magnetic multilayer film according to claim 1, wherein
the heavy metal layer is deposited by magnetron sputtering,
a partial pressure of an inert gas in a film forming process is 0.1 Pa or more,
a mean free path of a sputtered particle in a film forming process is shorter than a distance between a target of sputtering and a substrate of the sputtering,
a deposition rate of a thin film in a film forming process is 0.02 nm/s or less,
a substrate temperature is set to a room temperature or less in a film forming process, and
a bias voltage is applied to a substrate in a film forming process.

14. A method for producing a magnetic multilayer film or a magnetic memory element including the magnetic multilayer film, the magnetic multilayer film including:
a heavy metal layer containing a 5d transition metal; and
a first ferromagnetic layer that is adjacent to the heavy metal layer and contains a ferromagnetic layer having a reversible magnetization,
wherein
the heavy metal layer is deposited by magnetron sputtering, and
a partial pressure of an inert gas in a film forming process is 0.1 Pa or more.

15. A method for producing a magnetic multilayer film or a magnetic memory element including the magnetic multilayer film, the magnetic multilayer film including:
a heavy metal layer containing a 5d transition metal; and
a first ferromagnetic layer that is adjacent to the heavy metal layer and contains a ferromagnetic layer having a reversible magnetization,
wherein
the heavy metal layer is deposited by magnetron sputtering, and
a mean free path of a sputtered particle in a film forming process is shorter than a distance between a target of sputtering and a substrate of the sputtering.

16. The method for producing a magnetic multilayer film or a magnetic memory element according to claim 14, wherein a deposition rate of a thin film in a film forming process of the heavy metal layer is 0.02 nm/s or less.

17. The method for producing a magnetic multilayer film or a magnetic memory element according to claim 14, wherein a substrate temperature is set to a room temperature or less in a film forming process of the heavy metal layer.

18. The method for producing a magnetic multilayer film or a magnetic memory element according to claim 14, wherein a bias voltage is applied to a substrate in a film forming process of the heavy metal layer.

* * * * *